US012772622B2

(12) United States Patent
Miura

(10) Patent No.: US 12,772,622 B2
(45) Date of Patent: Oct. 20, 2026

(54) LIGHT EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 496 days.

(21) Appl. No.: 18/323,335

(22) Filed: May 24, 2023

(65) Prior Publication Data

US 2023/0387355 A1 Nov. 30, 2023

(30) Foreign Application Priority Data

May 26, 2022 (JP) ................................ 2022-086306

(51) Int. Cl.
*H10H 20/856* (2025.01)
*H10H 20/85* (2025.01)
*H10H 20/851* (2025.01)

(52) U.S. Cl.
CPC .... *H10H 20/8506* (2025.01); *H10H 20/8514* (2025.01); *H10H 20/856* (2025.01)

(58) Field of Classification Search
CPC ...... F21S 41/176; H10H 20/8515; F21K 9/64; H01S 5/02208; H01S 5/02325; H01S 5/0087; H01S 5/0611; H01S 5/00
See application file for complete search history.

(56) References Cited

U.S. PATENT DOCUMENTS

2010/0246159 A1* 9/2010 Wada ........................ F21K 9/00 257/E21.599
2010/0266241 A1 10/2010 Hosoda
2013/0329397 A1 12/2013 Shimizu et al.
2016/0268770 A1 9/2016 Tazawa et al.
2016/0285233 A1 9/2016 Victoria et al.
2017/0256685 A1 9/2017 Schug
2017/0314768 A1 11/2017 Kiyota et al.
2017/0317469 A1 11/2017 Kiyota
2018/0087726 A1* 3/2018 Yamashita .......... H01S 5/02255
2018/0217321 A1* 8/2018 Matsumoto .......... G02B 6/0091
(Continued)

FOREIGN PATENT DOCUMENTS

DE 202022104777 U1 4/2023
EP 2757599 A1 7/2014
(Continued)

*Primary Examiner* — Kretelia Graham
*Assistant Examiner* — Hamna Fathima Iqbal
(74) *Attorney, Agent, or Firm* — Spencer Fane LLP

(57) ABSTRACT

A light emitting device includes a package including a base member, a frame member having a plurality of inner lateral surfaces, and a cover, a light emitting element surrounded by the frame member and disposed on an upper surface of the base member, the light emitting element configured to emit directional light traveling in a lateral direction, and a light receiving body surrounded by the frame member and disposed on the upper surface of the base member in the lateral direction of the light emitting element to receive the light. The light receiving body has a first lateral surface facing the light emitting element and a second lateral surface opposite to the first lateral surface. The second lateral surface of the light receiving body faces a first opposing surface arranged adjacent to the second lateral surface with a space between the second lateral surface and the first opposing surface.

17 Claims, 14 Drawing Sheets

(56) References Cited

U.S. PATENT DOCUMENTS

| | | | | |
|---|---|---|---|---|
| 2020/0227890 | A1* | 7/2020 | Chen | H01S 5/02461 |
| 2020/0264500 | A1* | 8/2020 | Kozuru | H01S 5/02255 |
| 2022/0376462 | A1 | 11/2022 | Heikman | |
| 2023/0033309 | A1 | 2/2023 | Takigawa et al. | |

FOREIGN PATENT DOCUMENTS

| | | | |
|---|---|---|---|
| JP | 2003-243761 | A | 8/2003 |
| JP | 2010-251588 | A | 11/2010 |
| JP | 2010-251686 | A | 11/2010 |
| JP | 2011-171504 | A | 9/2011 |
| JP | 2013-254889 | A | 12/2013 |
| JP | 2016-167492 | A | 9/2016 |
| JP | 2017-199849 | A | 11/2017 |
| JP | 2017-199850 | A | 11/2017 |
| JP | 2017-201688 | A | 11/2017 |
| JP | 2018-056160 | A | 4/2018 |
| JP | 2018-512745 | A | 5/2018 |
| JP | 2019-204890 | A | 11/2019 |
| JP | 2020-038271 | A | 3/2020 |
| JP | 2020-181891 | A | 11/2020 |
| JP | 3228571 | U | 11/2020 |
| WO | 2010067291 | A1 | 6/2010 |
| WO | 2021-085164 | A1 | 5/2021 |
| WO | 2021166511 | A1 | 8/2021 |

* cited by examiner

LIGHT EMITTING DEVICE

CROSS-REFERENCE TO RELATED APPLICATIONS

The present application is based on and claims priority to Japanese patent application No. 2022-086306 filed on May 26, 2022, with the Japanese Patent Office, the entire contents of which are hereby incorporated by reference.

BACKGROUND

The present disclosure relates to light emitting devices.

Light emitting devices for emitting laser light may be required to have a safety measure for use of laser light. Japanese Laid-Open Patent Publication No. 2016-167492 discloses a light emitting device that includes a laser diode as a light emitting element, causes light emitted from the laser diode to enter a wavelength converter, converts the light entering the wavelength converter into light having a different wavelength, and emits the light to the outside. In this light emitting device, a fitting recess for fixing the wavelength converter is provided on a substrate, and the wavelength converter is fit into the fitting recess for fixed securement.

Due to the forming of the fitting recess conforming to the shape of the wavelength converter in the above-noted patent publication, the shape of the substrate becomes complicated, and the wavelength converter and the substrate are required to be formed with high manufacturing accuracy. There may be a need to provide a light emitting device in which the shape of a substrate does not become complicated for the purpose of conforming to the shape of a wavelength converter and which also takes safety into consideration.

SUMMARY

According to an embodiment, a light emitting device includes a package, a light emitting element, and a light receiving body. The package includes a base member, a frame member having a plurality of inner lateral surfaces, and a cover. The light emitting element is surrounded by the frame member and disposed on an upper surface of the base member. The light emitting element is configured to emit directional light traveling in a lateral direction. The light receiving body is surrounded by the frame member and disposed on the upper surface of the base member at a lateral side of the light emitting element to receive the light. The cover has a lower surface. At least a part of the lower surface of the cover is located over the light receiving body and the light emitting element. When an optical axis direction of the light is a first direction, the plurality of inner lateral surfaces of the package include a first inner lateral surface and a second inner lateral surface facing each other in a second direction perpendicular to the first direction in a top view. The light emitting element is disposed in a first arrangement region located between the first inner lateral surface and the second inner lateral surface. In the second direction, a length of the light receiving body is longer than a distance between the first inner lateral surface and the second inner lateral surface. In a third direction perpendicular to the upper surface of the base member, a height of an upper surface of the light receiving body from the upper surface of the base member is higher than a height of an upper surface of the light emitting element from the upper surface of the base member, a height of a lower surface of the light receiving body from the upper surface of the base member is lower than a height of a lower surface of the light emitting element from the upper surface of the base member, and a length of the light receiving body is longer than a distance from the upper surface of the light emitting element to the lower surface of the cover. The light receiving body has a first lateral surface facing the light emitting element and a second lateral surface opposite to the first lateral surface. The second lateral surface of the light receiving body faces a first opposing surface arranged adjacent to the second lateral surface with a space being formed between the second lateral surface and the first opposing surface.

According to at least one embodiment of the present disclosure, a light emitting device that takes safety into consideration is provided.

DETAILED DESCRIPTION

Figure 1:
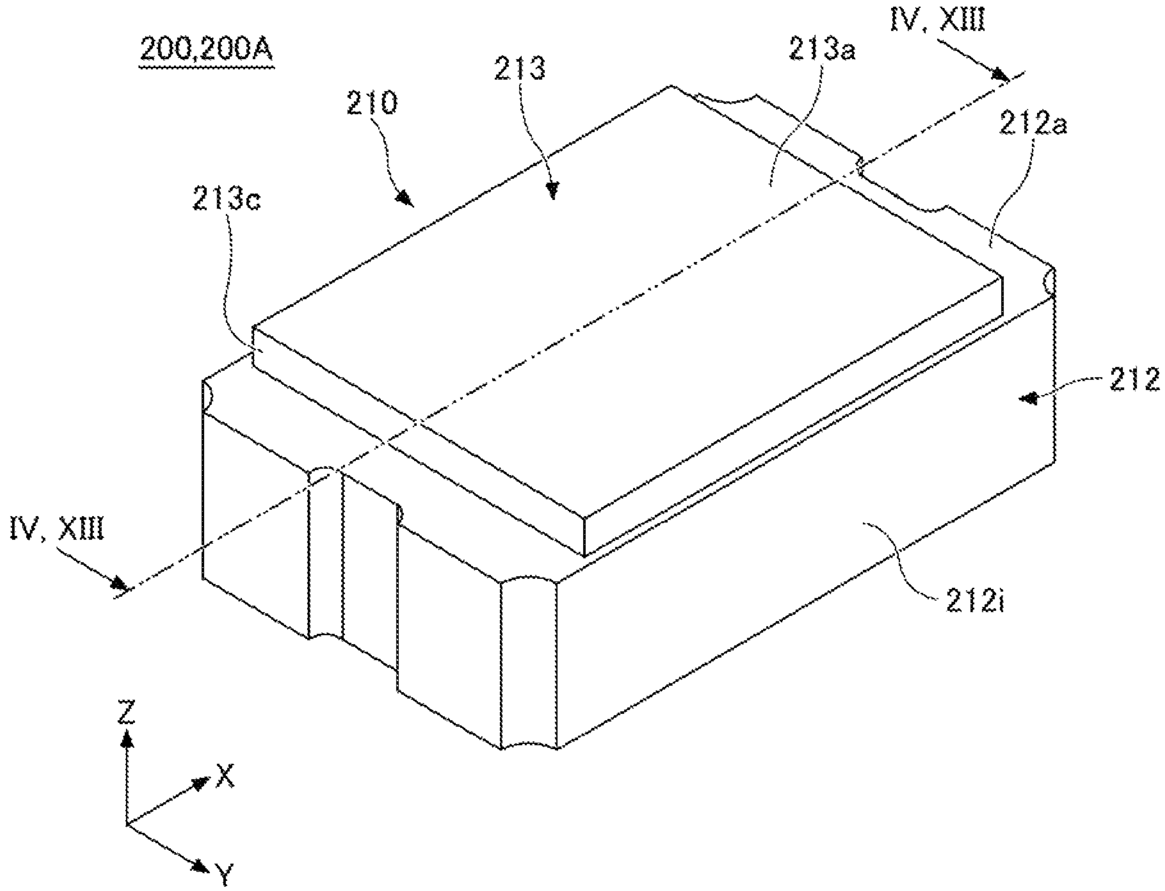
FIG. 1 is a schematic perspective view illustrating a light emitting device according to a first embodiment and a second embodiment.

In the following, embodiments for carrying out the invention will be described with reference to the drawings. In the following description, terms indicating a specific direction or position (for example, "upper", "lower", and phrases including these terms) are used as needed. However, these terms indicating directions and positions such as "upper" and "lower" used in the instant specification are intended only to specify relative directions and/or positional relationships of noted members in noted configurations, and may not coincide with, for example, relationships at the time of actual use. The same reference characters appearing in two or more drawings refer to the same or equivalent parts or members.

In the present disclosure, a polygon such as a triangle or a quadrangle is referred to as a polygon even when the polygon has a modified shape with one or more vertices thereof reshaped by corner rounding, beveling, corner cutting, sharpening, or the like. Further, a modified shape with not only the one or more vertices (i.e., the ends of edges) but also an intermediate part of one or more edges thereof being reshaped is also referred to as a polygon. In other words, a modified shape that is obtained by partial reshaping without substantially altering the polygonal base shape is within the meaning of the term "polygon" as used in the present disclosure.

Without being limited to the polygon, the same applies to other terms representing a specific shape such as a trapezoid, a circle, a concave, a convex, or the like. The same applies when an edge (i.e., side) of a given shape is considered. That is, even when an end or an intermediate portion of an edge is reshaped, the reshaped portion is also part of the edge according to the meaning of the term "edge". When a "polygon" or an "edge" without any partial reshaping needs to be distinguished from a modified shape, the term "exact" is added to recite, for example, "exact quadrangle" or the like.

The embodiments described below are intended only to be examples of a light emitting device or the like for embodying the technical concept of the present invention, and are not intended to limit the present invention thereto. Dimensions, materials, shapes, relative arrangements, and the like of components described below are not to limit the scope of the present invention thereto, and are intended as examples only, unless otherwise specified. What is described in one embodiment is applicable to other embodiments and variations thereof. The sizes, positional relationships, and the like of members illustrated in the drawings may be exaggerated for clearer illustration. Further, for the purpose of avoiding excessively complicated drawings, a schematic drawing may be used that omits some of the elements, or a cross-sectional end view may be used that illustrates only a cut face in a cross-sectional view.

First Embodiment

A light emitting device 200 according to a first embodiment will be described with reference to FIGS. 1 through 11.

Figure 2:
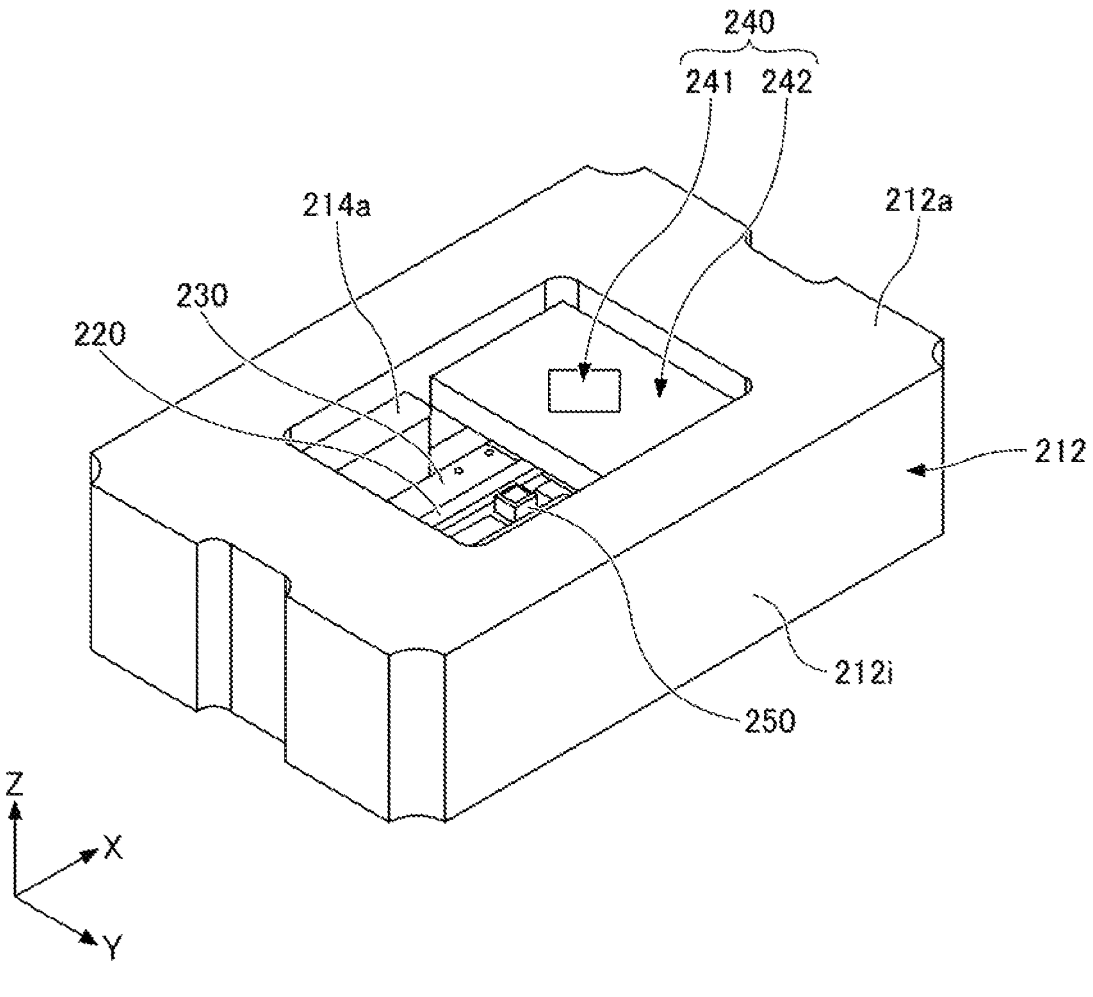
FIG. 2 is a schematic perspective view illustrating an internal structure of the light emitting device according to the first embodiment.
Figure 3:
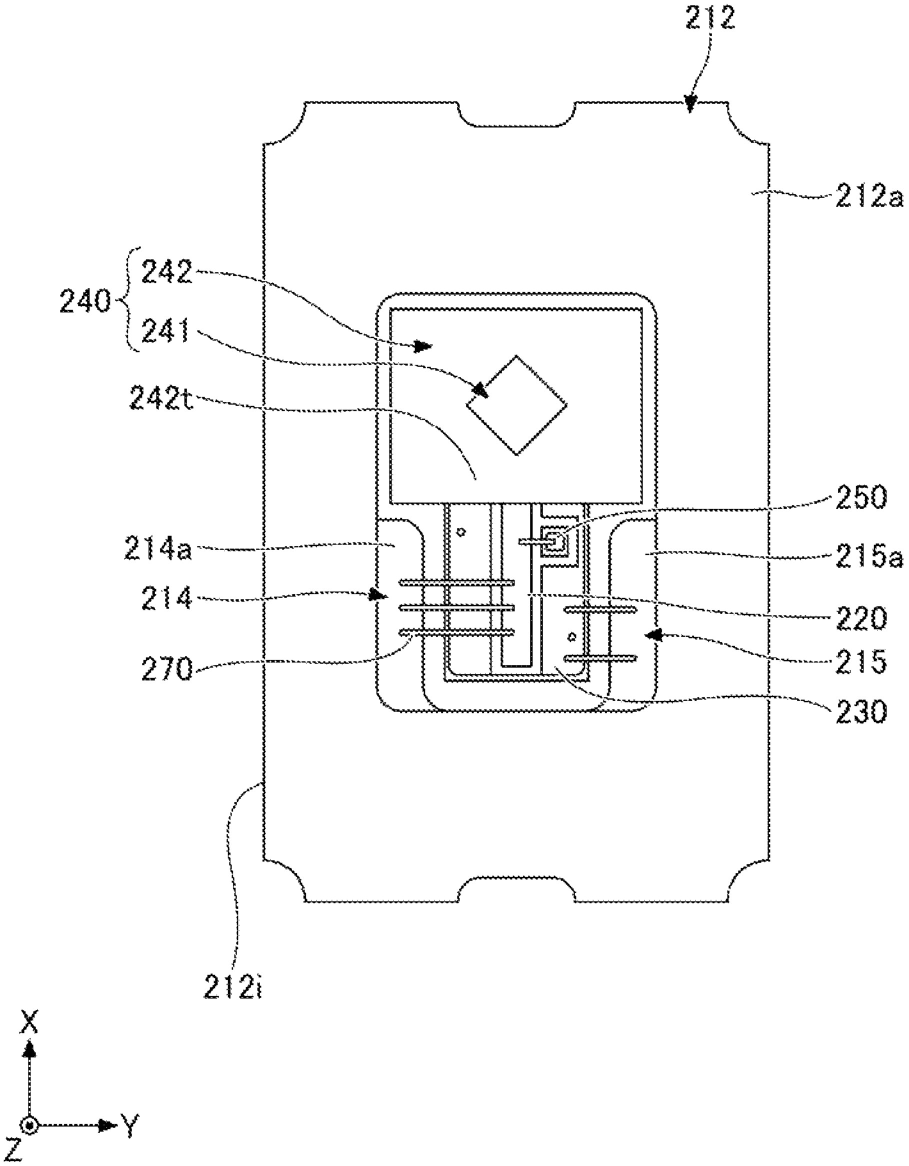
FIG. 3 is a schematic top view illustrating the internal structure of the light emitting device according to the first embodiment.
Figure 4:
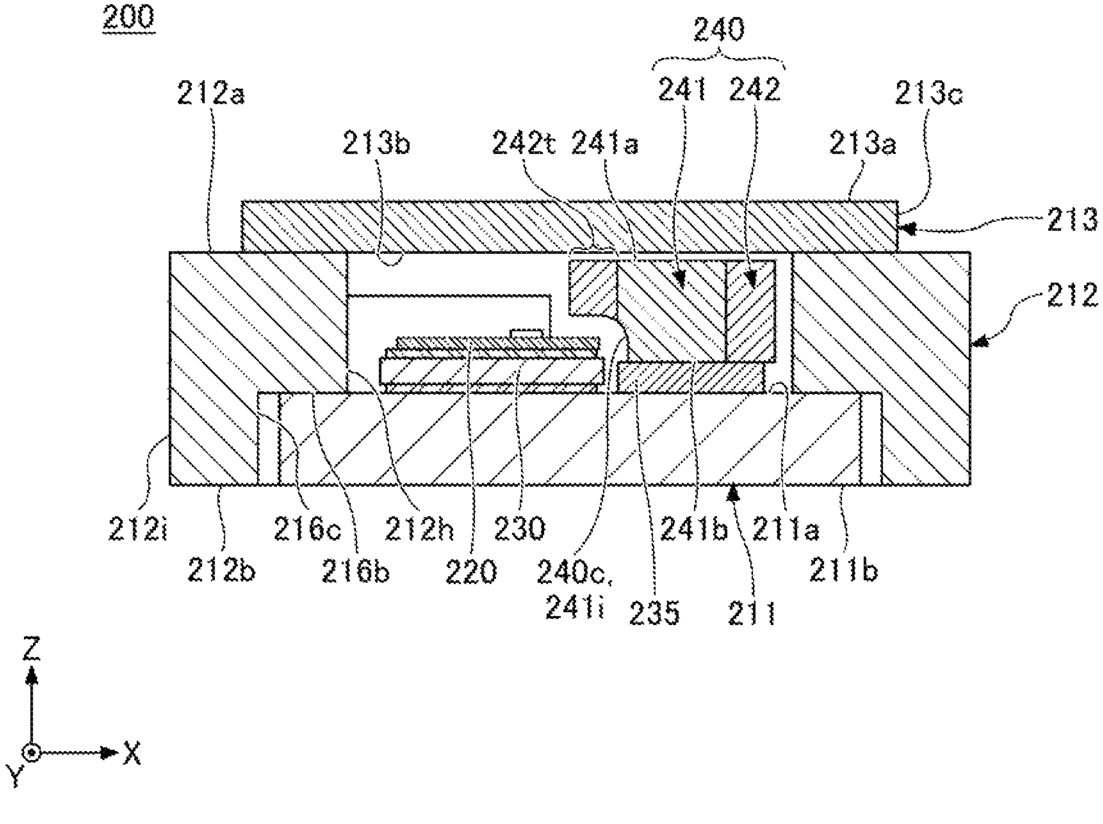
FIG. 4 is a schematic cross-sectional view taken along the line IV-IV in FIG. 3 and illustrating the light emitting device according to the first embodiment.
Figure 5:
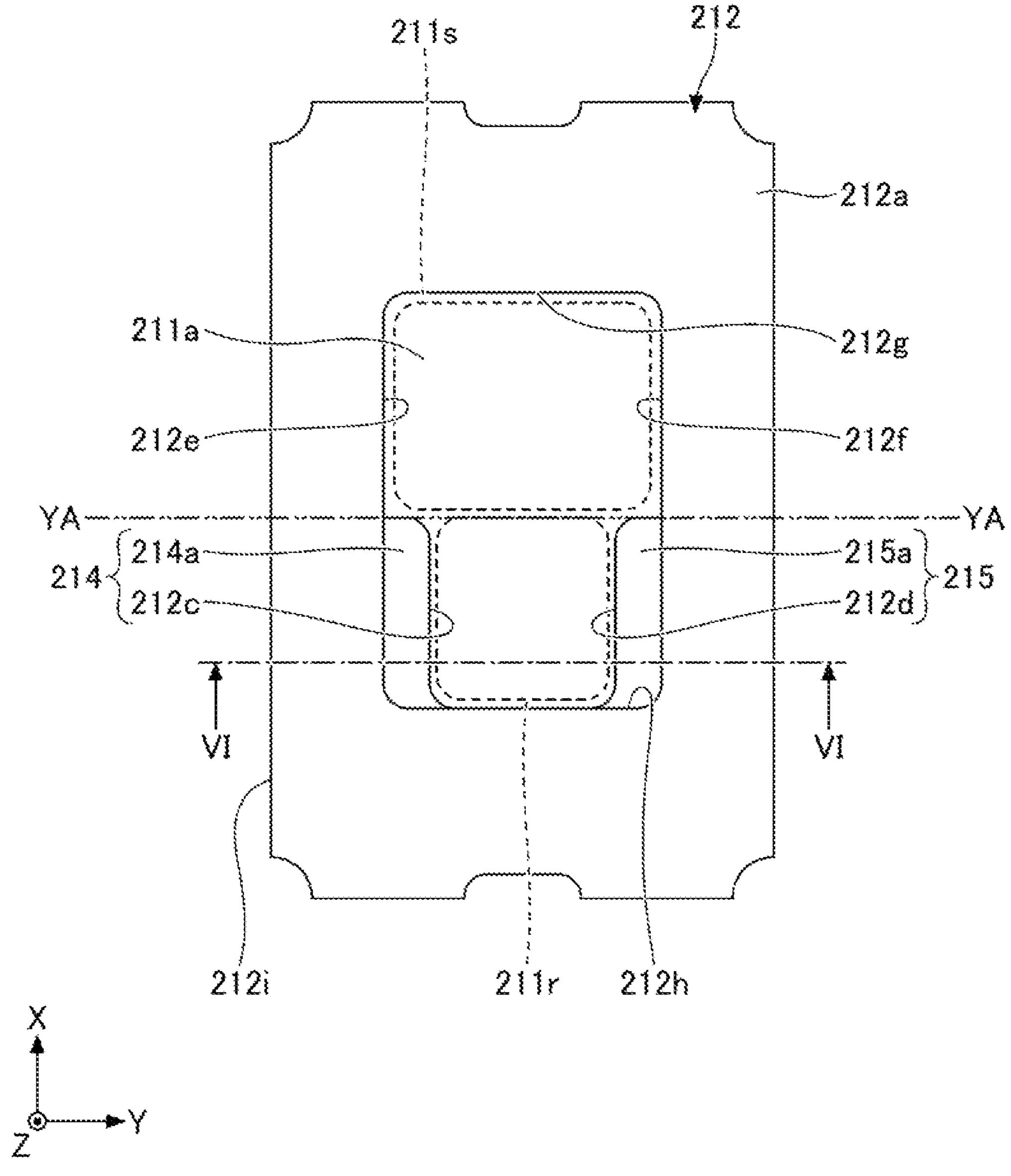
FIG. 5 is a schematic top view illustrating a base member and a frame member.
Figure 6:
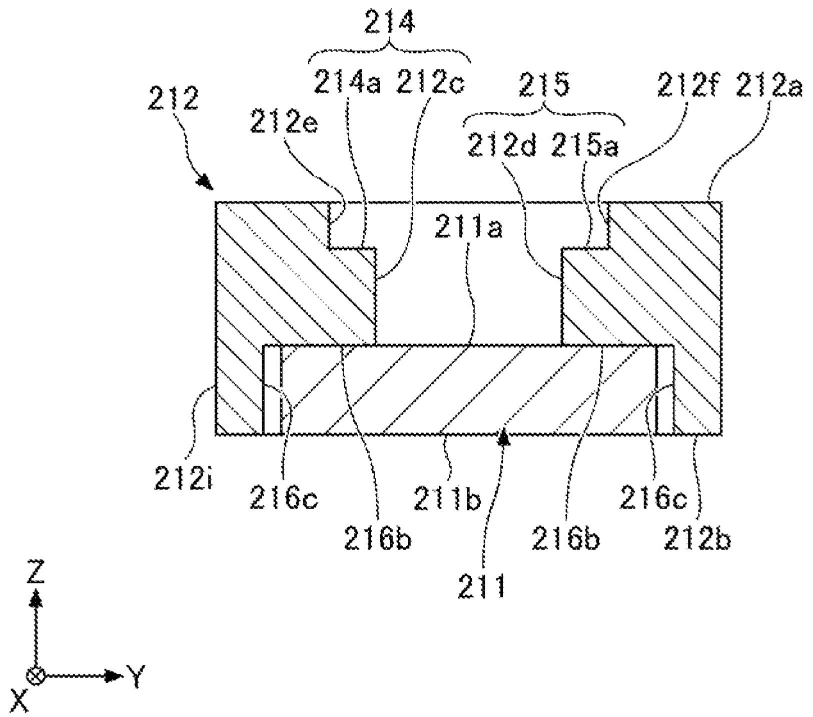
FIG. 6 is a schematic cross-sectional view taken along the line VI-VI in FIG. 5 and illustrating the base member and the frame member.
Figure 7:
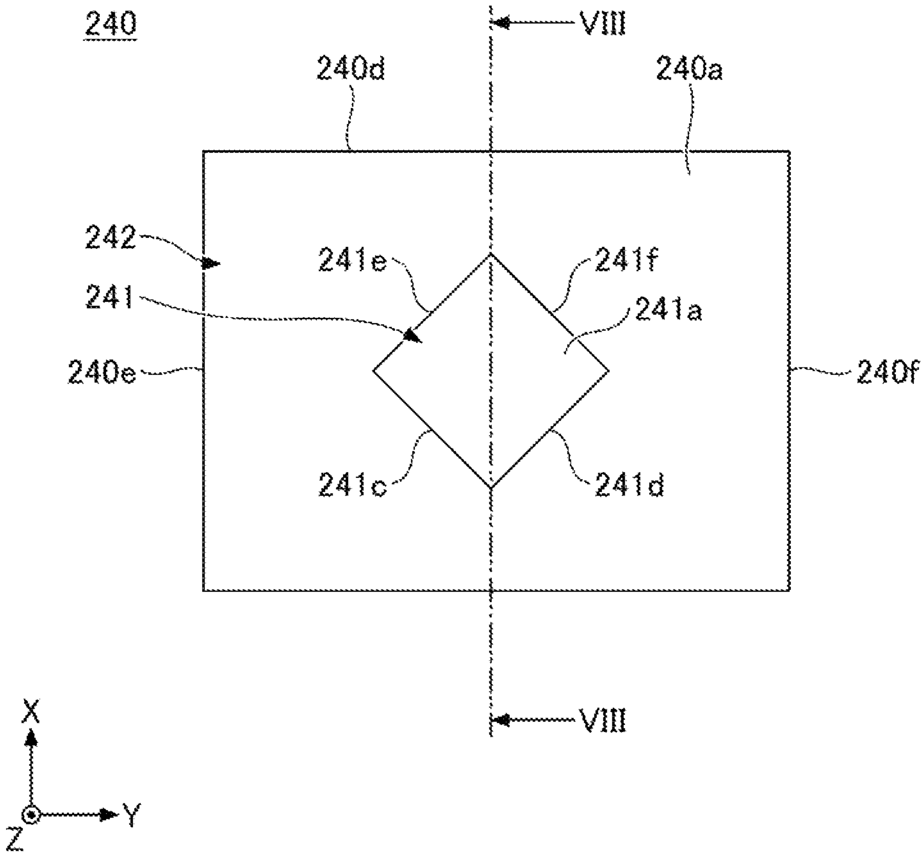
FIG. 7 is a schematic top view of a light receiving body illustrated in FIG. 3.
Figure 8:
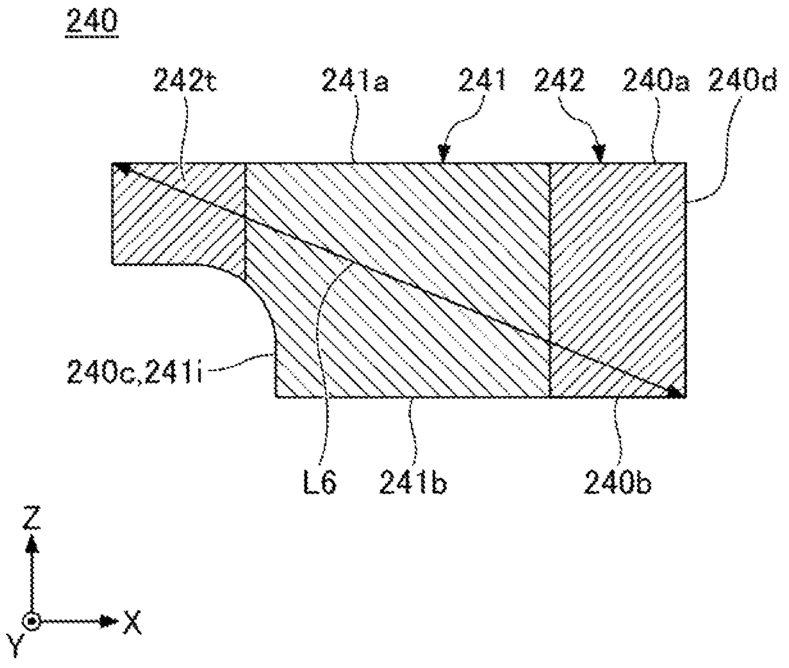
FIG. 8 is a schematic cross-sectional view of the light receiving body taken along the line VIII-VIII in FIG. 7.
Figure 9:
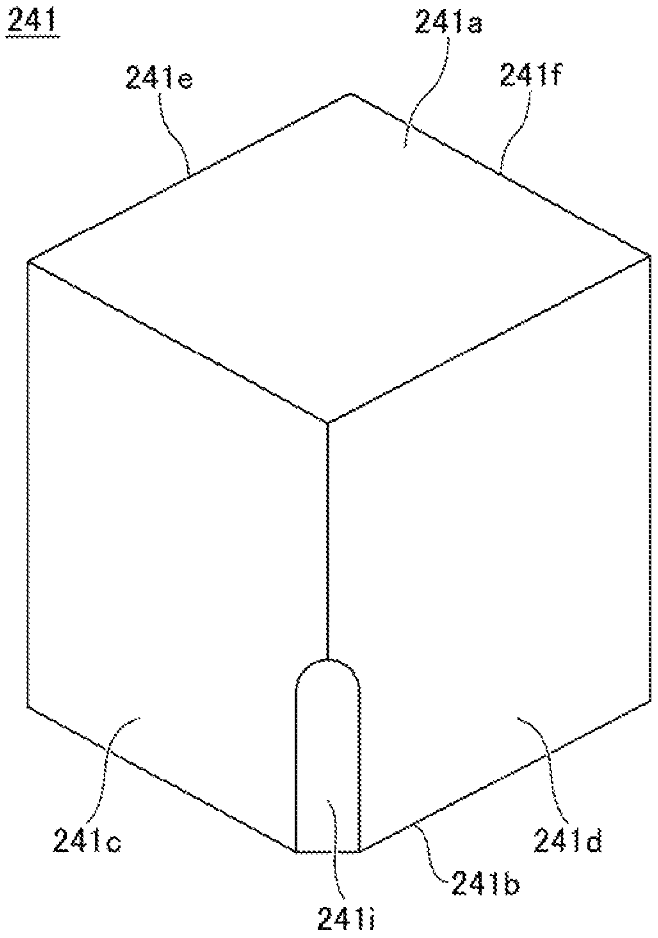
FIG. 9 is a schematic perspective view illustrating an example of a light incident portion.
Figure 10:
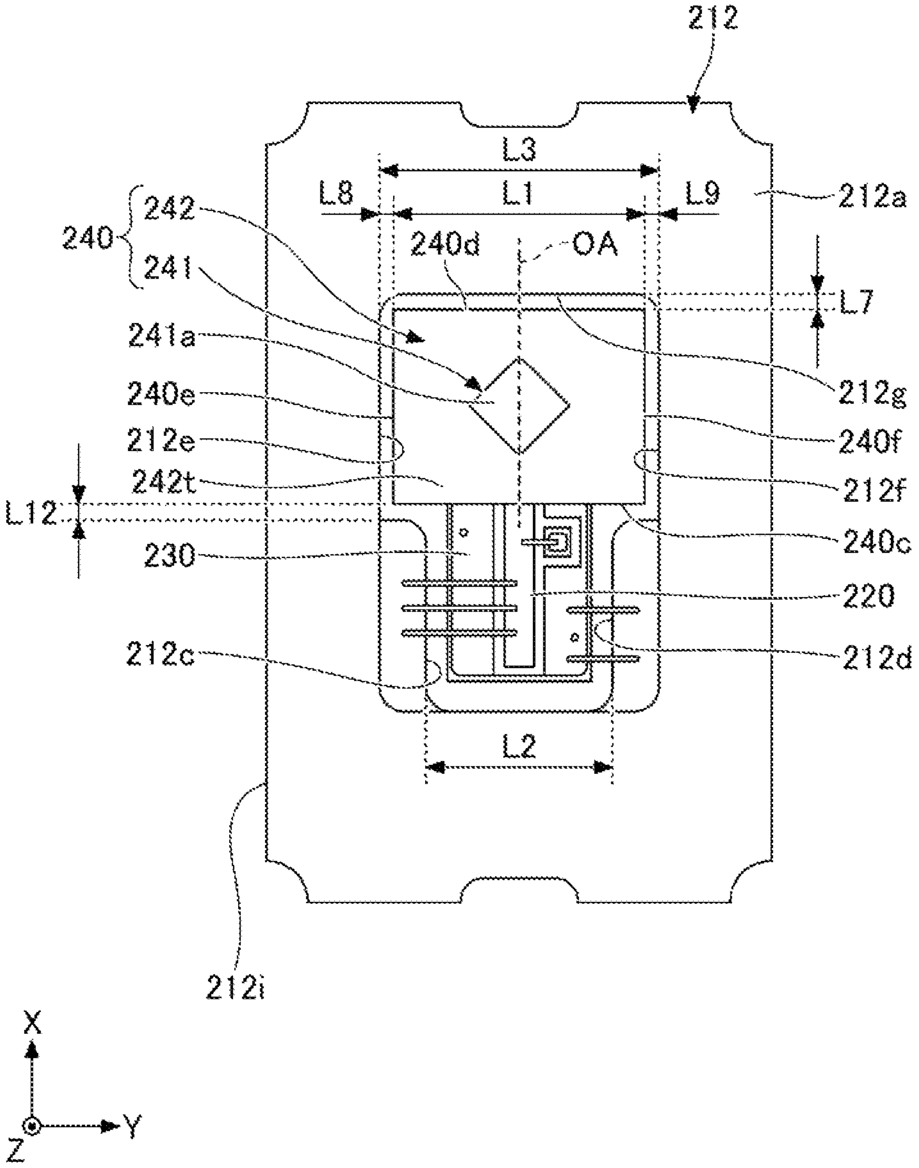
FIG. 10 is a schematic top view corresponding to FIG. 3 for use in describing further details of a light receiving body and a light emitting element of the light emitting device according to the first embodiment.
Figure 11:
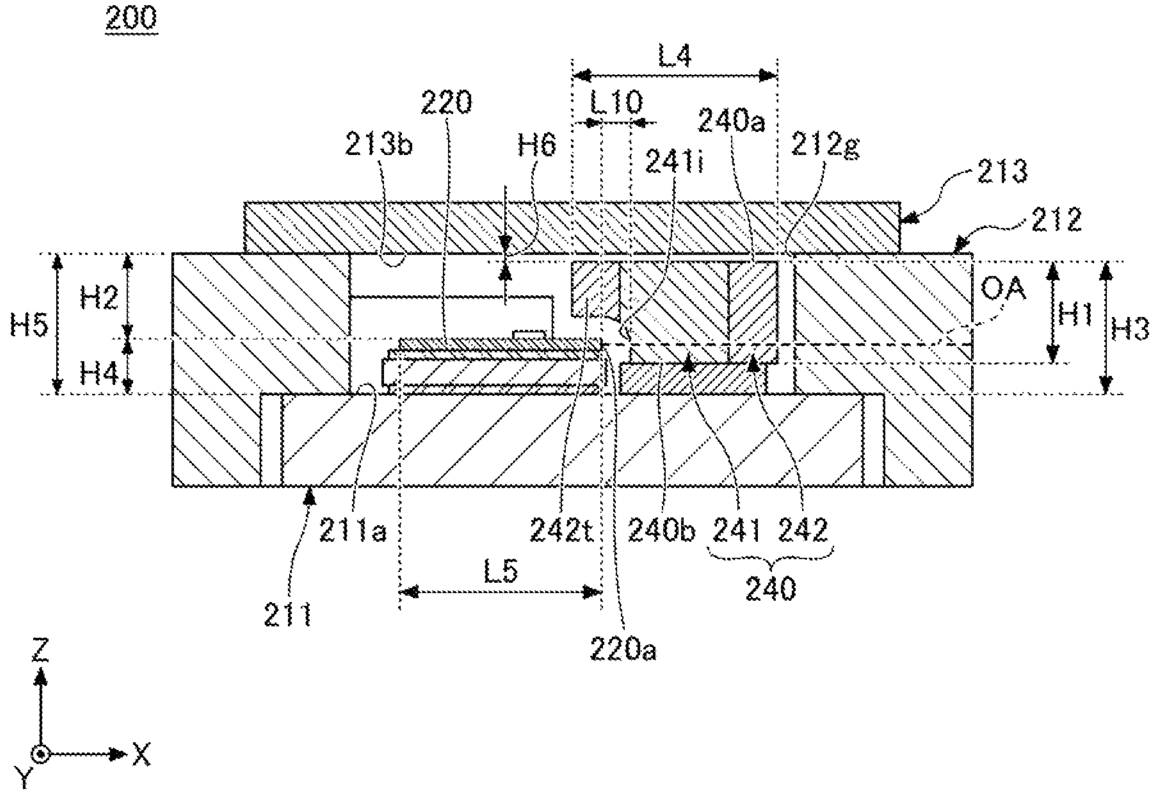
FIG. 11 is a schematic cross-sectional view corresponding to FIG. 4 for use in describing further details of the light receiving body and the light emitting element of the light emitting device according to the first embodiment.

FIG. 1 is a schematic perspective view illustrating an example of a light emitting device 200. FIG. 2 is a schematic perspective view illustrating an internal structure of the light emitting device 200. For convenience of description, illustration of wirings 270 shown in FIG. 3 are omitted in FIG. 2. FIG. 3 is a schematic top view illustrating the internal structure of the light emitting device 200. FIG. 4 is a schematic cross-sectional view taken along the line IV-IV in FIG. 1 and illustrating the example of the light emitting device 200. FIG. 5 is a schematic top view illustrating a base member 211 and a frame member 212. FIG. 6 is a schematic cross-sectional view taken along the line VI-VI in FIG. 5 and illustrating the base member 211 and the frame member 212. FIG. 7 is a schematic top view of a light receiving body 240 shown in FIG. 3. FIG. 8 is a schematic cross-sectional view of the light receiving body 240 taken along the line VIII-VIII in FIG. 7. FIG. 9 is a schematic perspective view illustrating an example of a light receiving portion 241. FIG. 10 is a schematic top view corresponding to FIG. 3 for use in describing further details of the light receiving body 240 and a light emitting element 220 of the light emitting device 200. FIG. 11 is a schematic cross-sectional view corresponding to FIG. 4 for use in describing further details of the light receiving body 240 and the light emitting element 220 of the light emitting device 200.

The light emitting device 200 includes a package 210, a light emitting element 220, and a light receiving body 240. In the illustrated example, the light emitting device 200 further includes submounts 230 and 235, a protective element 250, and wirings 270. It may be noted that these latter-listed components are not essential.

Each component of the light emitting device 200 will be described in the following.

In FIGS. 1 through 8, 10, and 11, an X-axis, a Y-axis, and a Z-axis orthogonal to each other are illustrated for reference. Directions parallel to the X-axis, the Y-axis, and the Z-axis are defined as a first direction X, a second direction Y, and a third direction Z, respectively. The first direction X and the second direction Y are parallel to the upper surface 211*a* of the base member 211, and the third direction Z is perpendicular to the upper surface 211*a* of the base member 211.

<Package 210>

The package 210 includes the base member 211, the frame member 212, and a cover 213. The base member 211 has the upper surface 211*a* and a lower surface 211*b*. The base member 211 has a rectangular outer shape in the top view. The rectangle may be a rectangle having long sides and short sides. The outer shape of the base member 211 in the top view is not necessarily rectangular. It is understood that the term "rectangle" in the present specification may also include a square unless specifically stated to exclude a square.

The frame member 212 is connected to the upper surface 211*a* of the base member 211 and extends upward from the upper surface 211*a*. The frame member 212 has one or more upper surfaces, a first lower surface 212*b*, a plurality of inner lateral surfaces, and one or more outer lateral surfaces 212*i*. The one or more upper surfaces of the frame member 212 include a first upper surface 212*a* meeting the one or more outer lateral surfaces 212*i*. The outer perimeter shape of the first upper surface 212*a* is, for example, rectangular. The inner perimeter shape of the first upper surface 212*a* is, for example, a rectangle. A plurality of inner lateral surfaces of the frame member 212 meet the upper surface 211*a* of the base member 211.

The base member 211 and the frame member 212 form a recess depressed from the first upper surface 212*a* of the frame member 212 toward the upper surface 211*a* of the base member 211. The recess is formed at a location inward of an outer periphery of the frame member 212 in the top view. In the top view, the upper surface 211*a* of the base member 211 is surrounded by a frame formed by a plurality of inner lateral surfaces of the frame member 212. The shape of the frame is a rectangle having long sides and short sides. The base member 211 and the frame member 212 are formed separately and bonded together. Alternatively, the base member 211 and the frame member 212 may be formed together as a single seamless piece.

In the package 210, stepped portions are formed inside the frame member 212. Specifically, the frame member 212 has a first stepped portion 214 and/or a second stepped portion 215 that are step-shaped in the top view. In the example illustrated in FIGS. 3, 5, and 6, the frame member 212 has a second upper surface 214*a* and a third upper surface 215*a* along the two edges, extending in the first direction X, of the inner perimeter of the first upper surface 212*a*. In the top view, the second upper surface 214*a* extends along one of the two edges, extending in the X direction, of the first upper surface 212*a*. In the top view, the third upper surface 215*a* extends along the other of the two edges, extending in the X direction, of the first upper surface 212*a*. The second upper surface 214*a* and the third upper surface 215*a* of the frame member 212 do not extend over the entire length of the two respective edges extending in the first direction X. The second upper surface 214*a* and the third upper surface 215*a* extend along only a portion of the two respective edges extending in the first direction X. In the illustrated example, both the second upper surface 214*a* and the third upper surface 215*a* are provided toward the negative X direction in the first direction X.

The frame member 212 further has one or more inner lateral surfaces meeting the second upper surface 214*a* and extending downward. The one or more inner lateral surfaces include a first inner lateral surface 212*c* that meets the second upper surface 214*a*. The first inner lateral surface 212*c* meets the upper surface 211*a* of the base member 211. In the illustrated example, the plurality of edges at which the first inner lateral surface 212*c* and the second upper surface 214*a* meet each other include an edge extending in the first direction X and an edge extending in the second direction Y in the top view. A curved line is further provided between the edge extending in the first direction X and the edge extending in the second direction Y Similarly, the edges at which the first inner lateral surface 212*c* and the upper surface 211*a* of the base member 211 meet each other include an edge extending in the first direction X and an edge extending in the second direction Y in the top view. A curved line is further provided between the edge extending in the first direction X and the edge extending in the second direction Y The first inner lateral surface 212*c* does not meet the first upper surface 212*a*.

The frame member 212 has one or more inner lateral surfaces meeting the third upper surface 215*a* and extending downward. The one or more inner lateral surfaces include a second inner lateral surface 212*d* meeting the third upper surface 215*a*. The second inner lateral surface 212*d* meets the upper surface 211*a* of the base member 211. In the illustrated example, the plurality of edges at which the second inner lateral surface 212*d* and the third upper surface 215*a* meet each other include an edge extending in the first direction X and an edge extending in the second direction Y in the top view. A curved line is further provided between the edge extending in the first direction X and the edge extending in the second direction Y Similarly, the edges at which the second inner lateral surface 212*d* and the upper surface 211*a* of the base member 211 meet each other include an edge extending in the first direction X and an edge extending in the second direction Y in the top view. A curved line is further provided between the edge extending in the first direction X and the edge extending in the second direction Y The second inner lateral surface 212*d* does not meet the first upper surface 212*a*. Alternatively, when the frame member 212 has only the first stepped portion 214 and does not include the second stepped portion 215, the second inner lateral surface 212*d* connects the first upper surface 212*a* and the upper surface 211*a* of the base member 211. In this case, the frame member 212 does not include a fourth inner lateral surface 212*f*, which will be described later.

The second upper surface 214*a* and the third upper surface 215*a* are located further inside than the inner perimeter of the first upper surface 212*a* in the top view. In the illustrated example, the second upper surface 214*a* and the third upper surface 215*a* are located above the upper surface 211*a* of the base member 211 and below the first upper surface 212*a* of the frame member 212. The second upper surface 214*a* and the third upper surface 215*a* are, for example, parallel to the upper surface 211*a* of the base member 211. The second upper surface 214*a* and the third upper surface 215*a* may alternatively be at the same height as the first upper surface 212*a*. The first inner lateral surface 212*c* and the second inner lateral surface 212*d* each have a portion facing each other in the second direction Y The portion of the first inner lateral surface 212*c* and the portion of the second inner lateral surface 212*d* facing each other meet the second upper surface 214*a* at an edge thereof extending in the first direction X and the third upper surface 215*a* at an edge thereof extending in the first direction X, respectively.

By referring to FIGS. 3, 5, and 6, a plurality of inner lateral surfaces of the frame member 212 will be further described. The plurality of inner lateral surfaces of the frame member 212 may further include a third inner lateral surface 212*e* and a fourth inner lateral surface 212*f* facing each other in the second direction Y The third inner lateral surface 212*e* meets the first upper surface 212*a* at an edge thereof extending in the first direction X, and extends downward. The third inner lateral surface 212*e* meets the upper surface 211*a* of the base member 211. The third inner lateral surface 212*e* also meets the second upper surface 214*a*. Similarly, the fourth inner lateral surface 212*f* meets the first upper surface 212*a* at the opposite edge thereof extending in the first direction X, and extends downward. The fourth inner lateral surface 212*f* meets the upper surface 211*a* of the base member 211. The fourth inner lateral surface 212*f* also meets the third upper surface 215*a*. When the second upper surface 214*a* and the third upper surface 215*a* are at the same height as the first upper surface 212*a*, the third inner lateral surface 212*e* meets the second upper surface 214*a* at a point on the edge of the first upper surface 212*a* extending in the X direction. Similarly, the fourth inner lateral surface 212*f* meets the third upper surface 215*a* at a point on the other edge of the first upper surface 212*a* extending in the X direction.

The third inner lateral surface 212*e* and the fourth inner lateral surface 212*f* oppose each other in the second direction Y The first inner lateral surface 212*c* and the third inner lateral surface 212*e* are located on the same side as one of the two edges extending in the first direction X. The second inner lateral surface 212*d* and the fourth inner lateral surface 212*f* are located on the same side as the other edge.

The plurality of inner lateral surfaces of the frame member 212 further include a fifth inner lateral surface 212*g* connected to the third inner lateral surface 212*e* and the fourth inner lateral surface 212*f*, and a sixth inner lateral surface 212*h* facing the fifth inner lateral surface 212*g* in the first direction X. The fifth inner lateral surface 212*g* meets the first upper surface 212*a* and extends downward. The fifth inner lateral surface 212*g* meets the upper surface 211*a* of the base member 211. The fifth inner lateral surface 212*g* meets neither the first inner lateral surface 212*c* nor the second inner lateral surface 212*d*. The sixth inner lateral surface 212*h* meets the first upper surface 212*a* and extends downward. The sixth inner lateral surface 212*h* meets the upper surface 211*a* of the base member 211. The sixth inner lateral surface 212*h* meets the first inner lateral surface 212*c* and the second inner lateral surface 212*d*. The third inner lateral surface 212*e* and the fourth inner lateral surface 212*f* are, for example, perpendicular to the second direction Y The fifth inner lateral surface 212*g* and the sixth inner lateral surface 212*h* are, for example, perpendicular to the first direction X. The first inner lateral surface 212*c* has a portion facing the fifth inner lateral surface 212*g* in the first direction X. Further, the second inner lateral surface 212*d* has a portion facing the fifth inner lateral surface 212*g* in the first direction X. These portions meet the second upper surface 214*a* at the edge thereof extending in the second direction Y and the third upper surface 215*a* at the edge thereof extending in the second direction Y, respectively.

The upper surface 211*a* of the base member 211 has a portion exposed inside the frame member 212. The upper surface 211*a* of the base member 211 includes a first arrangement region 211*r* and a second arrangement region 211*s*. In the top view, the first arrangement region 211*r* extends between the edge, extending in the first direction X, at which the first inner lateral surface 212*c* meets the upper surface 211*a* and the edge, extending in the first direction X, at which the second inner lateral surface 212*d* meets the upper surface 211*a*. In the top view, the second arrangement region 211*s* extends between the edge at which the third inner lateral surface 212*e* meets the upper surface 211*a* and the edge at which the fourth inner lateral surface 212*f* meets the upper surface 211*a*.

To be more specific, the first arrangement region 211*r* is located closer in the first direction X to the sixth inner lateral surface 212*h* than the edge at which the first inner lateral surface 212*c* and the third inner lateral surface 212*e* meet each other. The first arrangement region 211*r* does not extend toward the fifth inner lateral surface 212*g* beyond the edge at which the first inner lateral surface 212*c* and the third inner lateral surface 212*e* meet each other. The second arrangement region 211*s* is located closer in the first direction X to the fifth inner lateral surface 212*g* than the edge at which the first inner lateral surface 212*c* and the third inner lateral surface 212*e* meet each other. The second arrangement region 211*s* does not extend toward the sixth inner lateral surface 212*h* beyond the edge at which the first inner lateral surface 212*c* and the third inner lateral surface 212*e* meet each other.

A plane YA is set that includes both the edge at which the first inner lateral surface 212*c* meets the third inner lateral surface 212*e* and a straight line that meets this edge and that extends parallel to the second direction Y In the illustrated example, the plane YA includes the edge at which the second inner lateral surface 212*d* meets the fourth inner lateral surface 212*f*. The first arrangement region 211*r* is defined, in the plan view, by the plane YA, the first inner lateral surface 212*c*, the second inner lateral surface 212*d*, and the sixth inner lateral surface 212*h* on the upper surface 211*a* of the base member 211. The second arrangement region 211*s* is defined, in the plan view, by the plane YA, the third inner lateral surface 212*e*, the fourth inner lateral surface 212*f*, and the fifth inner lateral surface 212*g* on the upper surface 211*a* of the base member 211.

In the top view, the length of the second upper surface 214*a* in the first direction X is shorter than, for example, half of the length of the third inner lateral surface 212*e* in the first direction X. In the top view, the length of the third upper surface 215*a* in the first direction X is shorter than, for example, half of the length of the fourth inner lateral surface 212*f* in the first direction X.

The first stepped portion 214 and the second stepped portion 215 will be described in the following. The first stepped portion 214 refers to a step formed in the top view by a portion of the edge at which the first upper surface 212*a* and the third inner lateral surface 212*e* meet each other and the plurality of edges at which the second upper surface 214*a* and the first inner lateral surface 212*c* meet each other. The noted portion of the edge at which the first upper surface 212*a* and the third inner lateral surface 212*e* meet each other refers to the portion situated on the positive X axis side of the imaginary plane YA. Similarly, the second stepped portion 215 refers to a step formed in the top view by a portion of the edge at which the first upper surface 212*a* and the fourth inner lateral surface 212*f* meet each other and the plurality of edges at which the third upper surface 215*a* and the second inner lateral surface 212*d* meet each other. The "portion of the edge at which the first upper surface 212*a* and the fourth inner lateral surface 212*f* meet each other" in the example herein indicates the portion located at a side of the positive direction of the first direction X with respect to the plane YA.

One or more metal films may be provided on the second upper surface 214*a* and the third upper surface 215*a*. One or more metal films may also be provided on the first upper surface 212*a*. The one or more metal films provided on the second upper surface 214*a* and/or the third upper surface 215*a* may include a metal film electrically connected to a metal film provided on the first upper surface 212*a*. The metal films may be, for example, Ni/Au (i.e., metal films formed by laminating Ni and Au in this order), Ti/Pt/Au (i.e., metal films formed by laminating Ti, Pt, and Au in this order), or the like.

As illustrated in FIG. 6, the frame member 212 may further have a second lower surface 216*b* located opposite the second upper surface 214*a* and the third upper surface 215*a*. The second lower surface 216*b* is bonded to the upper surface 211*a* of the base member 211 via, for example, a metal adhesive. In the illustrated example, the second lower surface 216*b* overlaps a portion of the first upper surface 212*a* in the top view. The frame member 212 may further have one or more lateral surfaces 216*c* meeting the second lower surface 216*b* and extending downward. The lateral surfaces 216*c* further meet the first lower surface 212*b*. The second lower surface 216*b* is parallel to the upper surface 211*a* of the base member 211, for example. In the illustrated example, the lateral surfaces 216*c* are located apart from the lateral surface of the base member 211.

As illustrated in FIGS. 1 and 4, the cover 213 has an upper surface 213*a*, a lower surface 213*b*, and one or more lateral surfaces 213*c* meeting the upper surface 213*a* and the lower surface 213*b*. The one or more lateral surfaces 213*c* connect the outer perimeter of the upper surface 213*a* and the outer perimeter of the lower surface 213*b*. The cover 213 is, for example, a rectangular parallelepiped or a cube. In this case, the upper surface 213*a* and the lower surface 213*b* of the cover 213 are both rectangular, and the cover 213 has four rectangular lateral surfaces 213*c*.

The cover 213 is not limited to a rectangular parallelepiped or a cube. That is, the shape of the cover 213 in the top view is not limited to a rectangle, and may be any shape such as a circle, an ellipse, or a polygon.

The cover 213 is supported by the frame member 212 and disposed over the upper surface 211*a* of the base member 211. The outer peripheral portion of the lower surface 213*b* of the cover 213 is bonded to the first upper surface 212*a* of the frame member 212, for example. By bonding the cover 213 and the frame member 212, a sealed space surrounded by the base member 211, the frame member 212, and the cover 213 is formed. The lower surface 213*b* faces the upper surface 211*a* of the base member 211 via the sealed space. At least a portion of the lower surface 213*b* defines the sealed space.

The base member 211 may be formed of, for example, a metal as a main material. For example, copper, a copper alloy, or the like may be used as the metal. The frame member 212 may be formed of, for example, a ceramic as a main material. For example, aluminum nitride, silicon nitride, aluminum oxide, or silicon carbide may be used as the ceramic. Alternatively, both the base member 211 and the frame member 212 may be formed of, for example, a ceramic as a main material, or may be formed of another material having an insulating property as a main material.

The cover 213 may have a light transmitting region that transmits light of a predetermined wavelength. The light transmitting region constitutes part of the upper surface 213*a* and the lower surface 213*b* of the cover 213. The light transmitting region of the cover 213 may be formed of, for example, sapphire as a main material. Sapphire is a material having relatively high transmittance and relatively high strength. Alternatively, the main material of the light transmitting region of the cover 213 is not necessarily sapphire, and may be a light transmitting material including quartz, silicon carbide, glass, or the like. The portion other than the light transmitting region of the cover 213 may be formed of the same material as the light transmitting region to be a single seamless piece with the light transmitting region.

<Light-Emitting Element 220>

The illustrated example of the light emitting device 200 has one light emitting element 220 provided therein. Alternatively, the light emitting device 200 may have a plurality of light emitting elements. The light emitting element 220 emits directional light. The light emitting element 220 is, for example, a semiconductor laser element. In the example of the light emitting device 200 illustrated in FIGS. 1 through 5, a semiconductor laser element is used as the light emitting element 220.

The outer shape of the light emitting element 220 in the plan view is, for example, a rectangle. A lateral surface meeting one of the two short sides of the rectangle is an emission end surface of the light emitting element 220 from which light is emitted. The upper surface and the lower surface of the light emitting element 220 are larger in area than the emission end surface.

The case in which the light-emitting element 220 is a semiconductor laser element will be described below. Light (laser light) emitted from the light emitting element 220 exhibits divergence and an elliptical far field pattern (hereinafter referred to as "FFP") in a plane parallel to the emission end surface. The FFP indicates the shape or light intensity distribution of emitted light at a position away from the emission end surface face.

In the elliptical light emitted from the light emitting element 220, the direction passing through the major axis of the elliptical shape is defined as the fast axis direction of the FFP, and the direction passing through the minor axis of the elliptical shape is defined as the slow axis direction of the FFP. The fast axis direction of the FFP in the light emitting element 220 can correspond to the stacking direction in which a plurality of semiconductor layers including the active layer of the light emitting element 220 are stacked.

In addition, light having an intensity of $1/e^2$ or more of the peak intensity within the light intensity distribution of the FFP of the light emitting element 220 is referred to as the main portion of light. An angle corresponding to an intensity of $1/e^2$ in the light intensity distribution is referred to as an angle of divergence. The angle of divergence in the fast-axis direction of the FFP is larger than the angle of divergence in the slow-axis direction of the FFP.

Further, light passing through the center of the elliptical shape of the FFP, in other words, light with the peak intensity in the light intensity distribution of the FFP, is referred to as light traveling along the optical axis or light passing through the optical axis. An optical path of light traveling along the center of the elliptical shape of the FFP is referred to as the optical axis of the light.

A light emitting element that emits blue light, green light, or red light may be used as the light emitting element 220. In the present disclosure, blue light emitted by the light emitting element 220 refers to light whose emission peak wavelength is within a range of 420 nm to 494 nm. Green light refers to light whose emission peak wavelength is within a range of 495 nm to 570 nm. Red light refers to light whose emission peak wavelength is within a range of 605 nm to 750 nm. Examples of the light emitting element 220 that emits blue light or green light include a semiconductor laser element containing a nitride semiconductor. As the nitride semiconductor, for example, GaN, InGaN, or AlGaN may be used. Examples of the light emitting element 220 that emits red light include a semiconductor laser element containing any one of an InAlGaP-based semiconductor material, a GaInP-based semiconductor material, a GaAs-based semiconductor material, and an AlGaAs-based semiconductor material.

The color of light emitted from the light emitting element 220 is not limited to these examples. The light emitting element 220 may emit light having a wavelength outside the wavelength ranges described above.

<Submount 230>

The submount 230 has, for example, a rectangular parallelepiped shape and has a lower surface, an upper surface, and one or more lateral surfaces. The submount 230 has the smallest dimension in the vertical direction. It may be noted that the shape is not limited to a rectangular parallelepiped. The submount 230 is formed of, for example, aluminum nitride or silicon carbide, although other materials may alternatively be used. In addition, a metal film, for example, is provided on the upper surface of the submount 230.

<Submount 235>

The submount 235 may be formed of the same material as the submount 230, for example. It may be noted that a material different from that of the submount 230 may alternatively be used.

<Light Receiving Body 240>

The light receiving body 240 has a first lateral surface 240*c* and a second lateral surface 240*d* opposite to the first lateral surface 240*c*. The first lateral surface 240*c* and the second lateral surface 240*d* are, for example, parallel to the second direction Y.

As illustrated in FIGS. 7 and 8, the light receiving body 240 may have an upper surface 240*a* and a lower surface 240*b* opposite to the upper surface 240*a*. The upper surface 240*a* and the lower surface 240*b* are, for example, perpendicular to the third direction Z. As in the illustrated example, the light receiving body 240 may further have a third lateral surface 240*e* and a fourth lateral surface 240*f* meeting the second lateral surface 240*d* and extending in the first direction X. The third lateral surface 240*e* and the fourth lateral surface 240*f* may further meet the first lateral surface 240*c*.

In the example illustrated in FIGS. 7 and 8, the light receiving body 240 includes a light receiving portion 241 and a surrounding portion 242. The light receiving portion 241 has a light incident surface on which light is incident. The surrounding portion 242 has surfaces that cover a plurality of lateral surfaces of the light receiving portion 241. Not all the surfaces of the light receiving portion 241 are covered by the surrounding portion 242. At least the light incident surface of the light receiving portion 241 and the light emitting surface of the light receiving portion 241 are exposed without being covered by the surrounding portion 242. Alternatively, the light receiving body 240 is not necessarily constituted by both the light receiving portion 241 and the surrounding portion 242, and may be constituted, for example, by only the light receiving portion 241, or by the light receiving portion 241 with other components.

An example of the structure of the light receiving portion 241 will be described with reference to FIGS. 7 through 9. The structure or shape of the light receiving portion 241 is not limited to the structure or shape of this example. The light receiving portion 241 has, for example, an upper surface 241*a*, a lower surface 241*b* opposite to the upper surface 241*a*, and one or more lateral surfaces. In the illustrated example, the light receiving portion 241 has an incident lateral surface 241*i*, a first lateral surface 241*c*, a second lateral surface 241*d*, a third lateral surface 241*e*, and a fourth lateral surface 241*f* as the lateral surfaces. In the example illustrated in FIG. 8, the incident lateral surface 241*i* constitutes at least a part of the first lateral surface 240*c* of the light receiving body 240.

The first lateral surface 241*c*, the second lateral surface 241*d*, the third lateral surface 241*e*, and the fourth lateral surface 241*f* are connected to the outer perimeter of the upper surface 241*a* and the outer perimeter of the lower surface 241*b*. The third lateral surface 241*e* connects the first lateral surface 241*c* and the fourth lateral surface 241*f*. The fourth lateral surface 241*f* connects the second lateral surface 241*d* and the third lateral surface 241*e*.

The first lateral surface 241*c* and the second lateral surface 241*d* are connected to each other on the upper side, and are each connected to the incident lateral surface 241*i* on the lower side. The lower end of the incident lateral surface 241*i* is connected to the outer perimeter of the lower surface 241*b*. A lower side of the incident lateral surface 241*i* is recessed inward relative to the position of connection between the first lateral surface 241*c* and the second lateral surface 241*d*. In the example illustrated in FIG. 4, the recess is toward the positive X direction in the first direction X.

In the top view, the first lateral surface 241*c* and the fourth lateral surface 241*f* may be parallel to each other. In the top view, the second lateral surface 241*d* and the third lateral surface 241*e* may be parallel to each other. Moreover, in the top view, the first lateral surface 241*c* and the second lateral surface 241*d* may be perpendicular to each other, and the same applies to the first lateral surface 241*c* and the third lateral surface 241*e*, the third lateral surface 241*e* and the fourth lateral surface 241*f*, and the fourth lateral surface 241*f* and the second lateral surface 241*d*.

In the following, the surrounding portion 242 will be described. The surrounding portion 242 has an upper surface, one or more lower surfaces opposite to the upper surface, a plurality of inner lateral surfaces connected to the inner perimeter of the upper surface and coming into contact with the first through fourth lateral surfaces 241*c* through 241*f* of the light receiving portion 241, and a plurality of outer lateral surfaces connected to the outer perimeter of the upper surface and/or the outer edges of the lower surfaces. The surrounding portion 242 may have a reflectance of 80% or more and 100% or less with respect to light incident on the one or more inner lateral surfaces.

The surrounding portion 242 covers the first lateral surface 241*c* through the fourth lateral surface 241*f* of the light receiving portion 241. The incident lateral surface 241*i* of the light receiving portion 241 is not covered with the surrounding portion 242, and is exposed outside the surrounding portion 242. Thus, light incident, for example, on the incident lateral surface 241*i* and emitted from the lateral surfaces of the light receiving portion 241 is reflected back to the light receiving portion 241. The light incident on the light receiving portion 241 is emitted from the upper surface 241*a*.

In the top view, all edges connecting the upper surface and the outer lateral surfaces of the surrounding portion 242 are located apart from the first lateral surface 241*c*, the second lateral surface 241*d*, the third lateral surface 241*e*, and the fourth lateral surface 241*f* of the light receiving portion 241. In the illustrated example, some outer lateral surfaces of the surrounding portion 242 constitute the second lateral surface 240*d*, the third lateral surface 240*e*, and the fourth lateral surface 240*f* of the light receiving body 240. Further, one outer lateral surface of the surrounding portion 242 may form one plane continuous with the incident lateral surface 241*i* of the light receiving portion 241 to constitute the first lateral surface 240*c* of the light receiving body 240. In the top view, the outer lateral surfaces of the surrounding portion 242 may each be parallel or perpendicular to one of two diagonal lines of the light receiving portion 241. In the top view, the outer lateral surfaces of the surrounding portion 242 may each be either parallel or perpendicular to the incident lateral surface 241*i* of the light receiving portion 241.

The upper surface 241*a* of the light receiving portion 241 and the upper surface of the surrounding portion 242 may form one continuous flat surface. In addition, the lower surface of the light receiving portion 241 and one lower surface of the surrounding portion 242 may form one continuous flat surface.

In the illustrated example, the surrounding portion 242 further includes a protrusion 242*t*. The protrusion 242*t* is located above the incident lateral surface 241*i*, and protrudes further out than the incident lateral surface 241*i* toward the opposite side from the second lateral surface 240*d* in the direction perpendicular to the incident lateral surface 241*i*.

The protrusion 242*t* includes part of the upper surface, one outer lateral surface, and one lower surface of the surrounding portion 242. The lower surface of the protrusion 242*t* is different from the lower surface of the surrounding portion 242 constituting the lower surface 240*b* of the light receiving body 240. When the light receiving body 240 includes the protrusion 242*t*, the outer lateral surface meeting the upper surface of the surrounding portion 242 is not included in the first lateral surface 240*c*.

Although the shape of the light receiving body 240 has heretofore been described, the shape of the light receiving body 240 is not limited to the described shape. For example, the shape may be a rectangular parallelepiped shape, or may be a shape partially having an arc.

The light receiving body 240 is, for example, a wavelength conversion member. In this case, the light receiving portion 241 is a wavelength conversion portion having a phosphor. In the following, a description will be given with respect to an example of the structure in which the light receiving body is a wavelength conversion member.

In the case in which the light receiving portion 241 is a wavelength conversion portion, the light receiving portion 241 converts, for example, light incident on the incident lateral surface 241*i* into light having a different wavelength, and emits the converted light from, for example, the upper surface 241*a*. The light receiving portion 241 may convert part of the incident light into light having a different wavelength, or the light receiving portion 241 may convert all of the incident light into light having a different wavelength. Selectively, or additionally, an optical film such as a distributed Bragg reflector (DBR) film that transmits wavelength-converted light and reflects incident light may be provided on the upper surface of the wavelength conversion member or the wavelength conversion portion. Such an arrangement may be used as a design option to prevent part of the light incident on the light receiving portion 241 from being emitted from the upper surface 241*a* of the light receiving portion 241.

The base material of the light receiving portion 241 is preferably made of an inorganic material used as a main material that is hardly decomposed by light irradiation. The main material is, for example, a ceramic. Examples of the main material include sapphire and quartz in addition to ceramics. When the main material of the light receiving portion 241 is a ceramic, examples of the ceramic include aluminum oxide, aluminum nitride, silicon oxide, yttrium oxide, zirconium oxide, and magnesium oxide. It may be noted that the main material is a material that accounts for the largest proportion by weight or volume in the composition. Alternatively, the main material may be the sole substance of which a thing is made.

The light receiving portion 241 may be formed by, for example, sintering a phosphor and a light transmitting material such as aluminum oxide. The content of the phosphor may be set to 0.05 vol % to 50 vol % with respect to the total volume of the ceramic. Alternatively, a ceramic made by sintering a powder of a phosphor and substantially composed only of the phosphor, for example, may be used. Yet alternatively, the light receiving portion 241 may be formed of a single crystal of a phosphor.

Examples of a phosphor include cerium-activated yttrium-aluminum-garnet (YAG), cerium-activated lutetium-aluminum-garnet (LAG), europium-activated silicate ($(Sr, Ba)_2SiO_4$), α-sialon phosphor, and β-sialon phosphor. In particular, the YAG phosphor has good heat resistance.

The surrounding portion 242 is, for example, a sintered body formed of a ceramic as a main material. Examples of the ceramic used as the main material include aluminum oxide, aluminum nitride, silicon oxide, yttrium oxide, zirconium oxide, and magnesium oxide. Alternatively, the surrounding portion 242 does not necessarily contain a ceramic as a main material. The surrounding portion 242 may be made of, for example, one or more metals, a composite of one or more ceramics and one or more metals, a resin, or the like.

The light receiving body 240 may be configured by integrally forming the light receiving portion 241 and the surrounding portion 242. Alternatively, the light receiving portion 241 and the surrounding portion 242 may separately be formed and bonded together to form the light receiving body 240. For example, the light receiving portion 241 and the surrounding portion 242 may be integrally formed of sintered material. For example, an integral sintered body may be formed by forming a sintered body of the light receiving portion 241 and then forming a sintered body of the surrounding portion 242 integrally with the light receiving portion 241.

Although the case in which the light receiving body 240 is a wavelength conversion member has heretofore been described, the light receiving body 240 is not necessarily a wavelength conversion member. The light receiving body 240 is, for example, an object configured to receive light at a predetermined portion and emit light from another portion. More specifically, the light receiving body 240 is an object configured to receive directional light and emit non-directional light or less directional light than the incident directional light. Examples thereof include a light scattering body in addition to a wavelength conversion member. The light receiving portion 241, for example, may be formed as a light scattering portion. The provision of the surrounding portion 242 may not be necessary. Alternatively, the light receiving portion 241 may be a diffraction member that diffracts incident light and emits the light.

The light receiving body 240 may have, for example, an antireflection film on the upper surface 240*a*. The antireflection film may be provided on the upper surface 241*a* of the light receiving portion 241, or on both the upper surface 241*a* of the light receiving portion 241 and the upper surface of the surrounding portion 242. Further, the light receiving body 240 may have a metal film on the lower surface 241*b* of the light receiving portion 241 and the lower surface of the surrounding portion 242. Moreover, the light receiving body 240 may have, on the incident lateral surface 241*i* of the light receiving portion 241, a reflective film for reflecting light emitted outward from the incident lateral surface 241*i*.

<Protective Element 250>

The protective element 250 is a component for protecting a specific element such as a semiconductor laser element. For example, the protective element 250 is a component for preventing a specific element such as a semiconductor laser element from being broken by an excessive current flowing therethrough. As the protective element 250, for example, a Zener diode formed of Si may be used. For example, the protective element 250 may be a component for measuring the temperature to prevent a specific element from breaking due to the temperature environment. A thermistor may be used as such a temperature measuring element. The temperature measuring element is preferably disposed near the emission end face of the light emitting element 220.

<Wirings 270>

Each of the wirings 270 is formed of a conductor having a line shape with both ends serving as bonding portions. In other words, each of the wirings 270 have, at both ends of the line shape, respective bonding portions bonded to other components. The wirings 270 are used for electrical connection between two components. As the wirings 270, for example, metal wirings may be used. Examples of the metal include gold, aluminum, silver, copper, and tungsten.

<Light Emitting Device 200>

In the following, the light emitting device 200 will be described with reference to FIGS. 1 through 11.

In the light emitting device 200, the light emitting element 220 and the light receiving body 240 are disposed on the upper surface 211*a* of the base member 211. In the illustrated example, the light emitting element 220 is disposed on the upper surface 211*a* via the submount 230. The light receiving body 240 is disposed on the upper surface 211*a* via the submount 235. As will be described later, the submount 235 has the light receiving body 240 disposed thereon longer than the distance between the first inner lateral surface 212*c* and the second inner lateral surface 212*d*, and is thus longer than the submount 230 in the second direction Y In the third direction Z, the height of the submount 230 is higher than the height of the submount 235. Accordingly, the light emitted from the light emitting element 220 and traveling downward, in addition to the other emitted light, can be efficiently incident on the light receiving portion 241. The submount 230 and the submount 235 are bonded to the upper surface 211*a* via, for example, a metal adhesive.

The light emitting element 220 and the light receiving body 240 are surrounded by the frame member 212 at the upper surface 211*a* of the base member 211. To be more specific, the light emitting element 220 is arranged in the first arrangement region 211*r*. As in the illustrated example, the light emitting element 220 may extend from the first arrangement region 211*r* to the second arrangement region 211*s*. The light receiving body 240 is disposed in the second arrangement region 211*s*. The light receiving body 240 is not disposed in the first arrangement region 211*r*. The light emitting element 220 emits directional light in a lateral direction. The light traveling in the lateral direction is directed toward the first lateral surface 240*c* of the light receiving body 240.

Further, the cover 213 is disposed over the light emitting element 220 and the light receiving body 240. The light emitting element 220 and the light receiving body 240 are disposed in a sealed space formed by the base member 211, the frame member 212, and the cover 213.

In the present specification, the traveling direction of light traveling on the optical axis OA of light emitted from the light emitting element 220 may sometimes be referred to as a "light traveling direction". When one of two members is located upstream of the other member in the light traveling direction, the other member is referred to as being located "on the light traveling direction side" of the one member. In the illustrated example, the "light traveling direction" coincides with the positive X direction, and the one member being positioned "on the light traveling direction side" of the other member is the same as the one member being positioned further in the positive X direction than the other member. The optical axis OA of light emitted from the light emitting element 220 is, for example, parallel to the first inner lateral surface 212*c* and the second inner lateral surface 212*d*. The optical axis OA is, for example, perpendicular to the fifth inner lateral surface 212*g* and the sixth inner lateral surface 212*h*.

The light emitting element 220 is disposed such that the emission end surface 220*a* thereof faces in the same direction as one lateral surface of the submount 230. The emission end surface 220*a* of the light emitting element 220 is, for example, perpendicular to the first inner lateral surface 212*c* of the frame member 212.

One of the two lateral surfaces of the light emitting element 220 meeting the emission end surface 220*a* faces the first inner lateral surface 212*c* of the frame member 212. The noted one of the two lateral surfaces of the light emitting element 220 meeting the emission end surface 220*a* is, for example, parallel to the first inner lateral surface 212*c*. The other one of the two lateral surfaces of the light emitting element 220 meeting the emission end surface 220*a* faces the second inner lateral surface 212*d* of the frame member 212. The noted other one of the two lateral surfaces of the light emitting element 220 meeting the emission end surface 220*a* is, for example, parallel to the second inner lateral surface 212*d*.

The light receiving body 240 is disposed such that the first lateral surface 240*c* faces the light emitting element 220. To be more specific, the first lateral surface 240*c* is disposed such as to face the emission end surface 220*a* of light emitting element 220. In the illustrated example, the outer lateral surface of the protrusion 242*t* does not face the light emitting element 220. In the illustrated example, the protrusion 242*t* is disposed such as to overlap the light emitting element 220 in the top view. Accordingly, even when the submount 230 having the light emitting element 220 disposed thereon falls off and light is emitted upward, the light can be reflected by the protrusion 242*t*.

Further, the incident lateral surface 241*i* of the light receiving portion 241 constituting a part of the first lateral surface 240*c* faces the emission end surface 220*a* of the light emitting element 220. The light emitted from the emission end surface 220*a* and traveling sideways enters the incident lateral surface 241*i*. At least a portion of the incident lateral surface 241*i* is located below the optical axis OA. The light incident on the incident lateral surface 241*i* is emitted from, for example, the upper surface 241*a*. The light emitted from the upper surface 241*a* includes light entering the light receiving portion 241 and then reflected by the surrounding portion 242 to enter the light receiving portion 241 again. In the example illustrated in FIGS. 1 through 11, the upper surface 241*a* of the light receiving portion 241 serves as the emission surface of the light receiving body 240. In the case in which the light receiving portion 241 is a wavelength conversion portion including a phosphor, light incident on the incident lateral surface 241*i* is emitted upwards upon undergoing wavelength conversion.

The light receiving body 240 has the second lateral surface 240*d* opposite to the first lateral surface 240*c*. The second lateral surface 240*d* faces another component. The surface of the other component facing the second lateral surface 240*d* is referred to as a first opposing surface. In other words, the light emitting device 200 has a first opposing surface disposed adjacent to the light receiving member 240 and facing the second lateral surface 240*d* of the light receiving body 240. In the example illustrated in FIG. 10, the fifth inner lateral surface 212*g* of the frame member 212 is the first opposing surface.

The first opposing surface is not limited to the fifth inner lateral surface 212*g* of the frame member 212. Although not illustrated, another component such as a lens may be disposed opposite the light emitting element 220 in the first direction X with the light receiving body 240 interposed therebetween. In such a case, a surface of the component such as the lens facing the second lateral surface 240*d* of the light receiving body 240 constitutes the first opposing surface.

The light emitting device 200 may further include a second opposing surface facing the third lateral surface 240*e* of the light receiving body 240 and a third opposing surface facing the fourth lateral surface 240*f*. In the example illustrated in FIG. 10, the second opposing surface is the third inner lateral surface 212*e* of the frame member 212, and the third opposing surface is the fourth inner lateral surface 212*f* of the frame member 212.

As illustrated in FIG. 10, the length L1 of the light receiving body 240 in the second direction Y is longer than the distance L2 between the first inner lateral surface 212*c* and the second inner lateral surface 212*d* of the frame member 212. Such a dimensional relationship restricts the movement of the light receiving body 240 in the first direction X even when the light receiving body 240 falls off the base member 211. More specifically, the light receiving body 240 arranged in the second arrangement region 211*s* can be hindered from moving to the first arrangement region 211*r*. In the second direction Y, the distance L3 between the third inner lateral surface 212*e* and the fourth inner lateral surface 212*f* is longer than the distance L2 between the first inner lateral surface 212*c* and the second inner lateral surface 212*d*.

As illustrated in FIG. 11, the length H1 of the light receiving body 240 in the third direction Z is longer than the distance H2 from the upper surface of the light emitting element 220 to the lower surface 213*b* of the cover 213. With such a dimensional relationship, even when the light receiving body 240 falls off the base member 211, the light receiving body 240 can be prevented from moving in the first direction X to climb over the light emitting element 220. In the third direction Z, the height H3 of the upper surface 240*a* of the light receiving body 240 from the upper surface 211*a* of the base member 211 is higher than the height H4 of the upper surface of the light emitting element 220 from the upper surface 211*a* of the base member 211. The distance H6 between the upper surface 240*a* of the light receiving body 240 and the lower surface 213*b* of the cover 213 in the third direction Z is less than the difference between the thickness of the submount 230 and the thicknesses of the submount 235. Thus, the movement of the light receiving body 240 in the first direction X is properly restricted. More specifically, the movement of the light receiving body 240 toward the light emitting element 220 is properly restricted.

As described above, the structure of the light emitting device 200 is such that the movement of the light receiving body 240 is restricted in the first direction X and the third direction Z even when the light receiving body 240 falls off the base member 211. Therefore, even when the light receiving body 240 falls off the base member 211, the light receiving body 240 continues to stay at such a position as to receive light from the light emitting element 220. As a result, the light emitted from the light emitting element 220 is less likely to be directly emitted to the outside of the light emitting device 200, which enables the realization of a light emitting device 200 having excellent safety features.

In the first direction X, the length L4 of the light receiving body 240 is longer than the length L5 of the light emitting element 220. Further, in a side elevation view, the length L6 of the diagonal line of the light receiving body 240 is preferably longer than the distance in the third direction Z from the lower surface 240*b* of the light receiving body 240 to the lower surface 213*b* of the cover 213. Here, the length of the diagonal line of the light receiving body 240 refers to a line segment connecting a point closest to the light emitting element 220 on the upper surface 240*a* and a point closest to the first opposing surface on the lower surface 240*b* (which is, in the illustrated example, the fifth inner lateral surface 212*g*). This arrangement allows for reducing the movement of the light receiving body 240 in the rotational direction in the side elevation view.

It is preferable that the light receiving body 240 is directly or indirectly fixed to the base member 211 only at the lower surface 240*b* thereof. In the illustrated example, the lower surface 240*b* of the light receiving body 240 is in contact with the upper surface of the submount 235. The upper surface and one or more lateral surfaces of the light receiving body 240 are located apart from other members. That is, there is a space between the second lateral surface 240*d* of the light receiving body 240 and the first opposing surface. There is a space between the third lateral surface 240*e* and the second opposing surface. There is a space between the fourth lateral surface 240*f* and the third opposing surface. There is a space between the upper surface 240*a* and the lower surface 213*b* of the cover 213.

Since spaces are provided between the lateral surfaces of the light receiving body 240 and the opposing surfaces facing these lateral surfaces as described above, the position of the light receiving body 240 is easily adjusted when mounted in the light emitting device 200. Further, such an arrangement improves the degree of freedom in layout in the light emitting device 200.

In the illustrated example, the lower surface 240*b* of the light receiving body 240 is bonded to the upper surface of the submount 235 using a bonding member. The upper surface of the submount 235 is not located higher than the lower surface of the light emitting element 220. In the illustrated example, the upper surface of the submount 235 is located lower than the lower surface of the light emitting element 220. As a result, the light emitted from the light emitting element 220 and traveling below the optical axis can be efficiently received by the light receiving portion 241 at the incident lateral surface 241*i*.

In the illustrated example, in a side elevation view, the end point of the lower surface 240*b* of the light receiving body 240 located furthest toward the light traveling direction side is located further toward the light traveling direction side than the end point of the upper surface of the submount 235 located furthest to the light traveling direction side. Such an arrangement allows for reducing the distance between the light receiving body 240 and the first opposing surface (fifth inner lateral surface 212*g*). The end point of the upper surface of the submount 235 located furthest in the direction opposite to the light traveling direction is located further in the direction opposite to the light traveling direction than the end point of the lower surface 240*b* of the light receiving body 240 located furthest in the direction opposite to the light traveling direction. With this arrangement, the entire lower surface of the light receiving portion 241 receiving light from the light emitting element 220 is bonded to the upper surface of the submount 235, which thus enables efficient heat dissipation.

In the following, a specific example of a dimensional relationship in the light emitting device 200 will be described. In the first direction X, the length L7 of the space between the first opposing surface (in the illustrated example, the fifth inner lateral surface 212*g* of the frame member 212) and the second lateral surface 240*d* is 50 μm or more and 400 μm or less. With the length L7 of 50 μm or more, the easiness of mounting and the degree of freedom in layout can be improved. With the length L7 of 400 μm or less, the movement of the light receiving body 240 in the first direction X can be reduced.

In the second direction Y, each of the length L8 of the space between the third inner lateral surface 212*e* (second opposing surface) of the frame member 212 and the third lateral surface 240*e* of the light receiving body 240 and the length L9 of the space between the fourth inner lateral surface 212*f* (third opposing surface) of the frame member 212 and the fourth lateral surface 240*f* of the light receiving body 240 are preferably 50 μm or more and 400 μm or less. Setting each of the length L8 and the length L9 to 50 μm or more allows for improving the easiness of mounting and the degree of freedom in layout. Setting each of the length L8 and the length L9 to 400 μm or less allows for reducing the movement of the light receiving body 240 in the second direction Y In the second direction Y, further, the length L1 of the light receiving body 240 is preferably not less than 0.6 times, and not more than 0.95 times, the distance L3 between the third inner lateral surface 212*e* and the fourth inner lateral surface 212*f* of the frame member 212.

In the third direction Z, the length H6 of the space between the upper surface 240*a* of the light receiving body 240 and the lower surface 213*b* of the cover 213 is preferably 50 μm or more and 400 μm or less. Having a length H6 of 50 μm or more allows for improving the easiness of mounting and the degree of freedom in layout. Having a length H6 of 400 μm or less allows for reducing the movement of the light receiving body 240 in the third direction Z. In the third direction Z, further, the length H1 of the light receiving body 240 is preferably not less than 0.05 times, and not more than 0.99 times, the distance H5 from the upper surface 211*a* of the base member 211 to the lower surface 213*b* of the cover 213, and is more preferably not less than 0.2 times, and not more than 0.95 times, the distance H5.

In the first direction X, the length L4 of the light receiving body 240 is preferably not less than 0.5 times, and not more than 1.1 times, the distance from the emission end surface 220*a* of the light emitting element 220 to the fifth inner lateral surface 212*g* of the frame member 212. In the first direction X, the distance L10 from the incident lateral surface 241*i* to the emission end surface 220*a* of the light emitting element 220 is preferably 5 μm or more and 1000 μm or less. The distance L10 is more preferably 400 μm or less.

The light receiving body 240 may be configured such that the length of the upper surface 240*a* in the first direction X is, for example, 20 μm or more and 3000 μm or less. The length of the upper surface 240*a* in the second direction Y may be 20 μm or more and 3000 μm or less. The length from the upper surface 240*a* to the lower surface 240*b* in the third direction Z may be 20 μm or more and 3000 μm or less.

In the side elevation view, the cross-sectional area of the light receiving body 240 taken along the XZ plane passing through the midpoint of the edge extending in the second direction Y of the upper surface 240*a* is preferably larger than the cross-sectional area of the light emitting element 220 taken along the XZ plane passing through the midpoint of the edge extending in the second direction Y of the upper surface thereof. Further, the volume of the light receiving body 240 is preferably larger than the volume of the light emitting element 220. Moreover, the volume of the sealed space defined by the base member 211, the frame member 212, and the cover 213 of the package 210 does not exceed 20 times the volume of the light receiving body 240. Preferably, the volume of the sealed space is equal to or less than 10 times the volume of the light receiving body 240.

In the top view, the length of the diagonal line of the upper surface 240*a* of the light receiving body 240 is longer than the length L3. With such a length, the movement of light receiving body 240 in the rotational direction in the XY plane can be reduced. To be more specific, the diagonal line of the upper surface 240*a* of the light receiving body 240 is allowed to rotate only up to 30 degrees or less in the rotational direction in the XY plane in the top view.

In the case in which the light receiving portion 241 is a wavelength conversion portion, light (first light) emitted from the light emitting element 220 is incident on the incident lateral surface 241*i* of the wavelength conversion portion, and is converted into light (second light) having a different wavelength from the first light by the wavelength conversion portion. The first light having entered the incident lateral surface 241*i* is emitted from the upper surface 241*a*. Also, the second light after the conversion is emitted from the upper surface 241*a*. The first light and the second light are emitted upward from the upper surface 241*a* of the light receiving portion 241. In this manner, the wavelength conversion member having the light incident surface on the lateral side thereof and the light emitting surface on the upper side thereof is provided, thereby realizing wavelength conversion and optical path conversion from the lateral direction to the upper direction.

In the top view, the upper surface 241*a* of the light receiving portion 241 may be symmetric with respect to the optical axis OA. Further, the upper surface of the surrounding portion 242 may be symmetric with respect to the optical axis OA in the top view. The direction of the optical axis OA is parallel to the first direction X.

In the illustrated example, the protrusion 242*t* protrudes further toward the light emitting element 220 than the end of the lower surface 240*b* of the light receiving body 240 located at the light emitting element 220 side. The protrusion 242*t* is preferably disposed such as to overlap the emission end surface 220*a* of the light emitting element 220 in the top view. The protrusion 242*t* is more preferably disposed such as to overlap the entire emission end surface 220*a* of the light emitting element 220 in the top view.

The second upper surface 214*a* and/or the third upper surface 215*a* are higher than the height of the upper surface of the light emitting element 220, as measured from the upper surface 211*a* of the base member 211, for example. In the illustrated example, the second upper surface 214*a* and/or the third upper surface 215*a* are at a position lower than the height of the upper surface 240*a* of the light receiving body 240, as measured from the upper surface 211*a* of the base member 211, for example. Similarly, the second upper surface 214*a* and/or the third upper surface 215*a* are at a position lower than the upper surface 241*a* of the light receiving portion 241, as measured from the upper surface 211*a*. The second upper surface 214*a* and/or the third upper surface 215*a* are higher than the lower surface of the light receiving body 240 belonging to the protrusion 242*t*, as measured from the upper surface 211*a*. Since the upper surface 240*a* of the light receiving body 240 is at a position higher than the second upper surface 214*a* and/or the third upper surface 215*a*, an increase in the length of H6 can be reduced. Further, since the lower surface of the light receiving body 240 belonging to the protrusion 242*t* is at a position lower than the second upper surface 214*a* and/or the third upper surface 215*a*, any movement of the light receiving body 240 toward the light emitting element 220 causes the protrusion to come in contact with the first inner lateral surface 212*c* and/or the second inner lateral surface 212*d*. Accordingly, it is possible to improve the effect of restricting the movement of the light receiving body 240 in the first direction X.

In the first direction X, the distance L12 from the end of the protrusion 242*t* of the light receiving body 240 to the end of the first inner lateral surface 212*c* of the frame member 212 on the side closer to the emission end surface 220*a* is smaller than the distance L10. With such a distance, if the light receiving body 240 falls off, the protrusion 242*t* comes into contact with the first inner lateral surface 212*c* before the incident lateral surface 241*i* comes into contact with the emission end surface 220*a*. The light emitting device can thus be configured to further restrict the movement of the light receiving body 240. The distance L12 is, for example, 30 μm or more and 500 μm or less. 30 μm is the shortest possible distance at which the end of the protrusion 242*t* and the end of the first inner lateral surface 212*c* can be brought close to each other in the first direction X. Further, by setting the distance between the end of the protrusion 242*t* and the end of the first inner lateral surface 212*c* to 500 μm or less in the first direction X, it is possible to reduce the misalignment of the light receiving body 240 in the rotation direction in the top view.

In the light emitting device 200, the light emitting element 220 and the protective element 250 are electrically connected to the metal films provided on the base member 211 and/or the frame member 212 by one or more of the wirings 270. Such one or more wirings 270 of the light emitting device 200 illustrated in the drawings are those of a specific example in which the protective element 250 is a Zener diode. In a case in which the protective element 250 is a temperature measuring element, wire connections may possibly be different from the illustrated example.

The light emitting element 220 is electrically connected to the metal film provided on the second upper surface 214*a* and/or the third upper surface 215*a* via some of the wirings 270. As is illustrated, the light emitting device 200 includes a plurality of wirings 270. These wirings 270 include wirings 270 that have one of the two opposite ends thereof bonded to the second upper surface 214*a* and the other end thereof bonded to the upper surface of the light emitting element 220, and also include wirings 270 that have one of the two opposite ends thereof bonded to the third upper surface 215*a* and the other end thereof bonded to the submount 230.

The electrical connection between the light emitting element 220 and an external power supply may be provided through the metal film provided on the lower surface 211*b* of the base member 211 and/or the first lower surface 212*b* of the frame member 212. The metal film provided on the lower surface 211*b* and/or the first lower surface 212*b* may be electrically connected to the metal film provided on the second upper surface 214*a* and/or the third upper surface 215*a* through a metal material provided in via holes, and thereby establishes electrical connection between the light emitting element 220 and the external power supply.

The cover 213 has the light transmitting region through which light emitted from the upper surface 240*a* of the light receiving body 240 is transmitted and emitted to the outside. The entire lower surface 213*b* of the cover 213 may serve as a light incident surface, and the entire cover 213 may be the light transmitting region. The light transmitting region of the cover 213 preferably transmits 50% or more, more preferably 70% or more, of the light emitted from the light emitting element 220 and the light emitted from the light receiving body 240. There may be a case in which only a part of the cover 213 constitutes a light transmitting region.

The cover 213 may include a light shielding portion. The light shielding portion prevents light from entering the lower surface 213*b* or light from exiting from the upper surface 213*a*. The light shielding portion constitutes part of the upper surface 213*a* or the lower surface 213*b* of the cover 213. The light shielding portion may be partially provided on, for example, the upper surface 213*a* and/or the lower surface 213*b* of the cover 213. The light shielding portion may be formed, for example, by using a light shielding material including a metal or the like to form a portion other than the light transmitting region of the cover 213.

Second Embodiment

Figure 12:
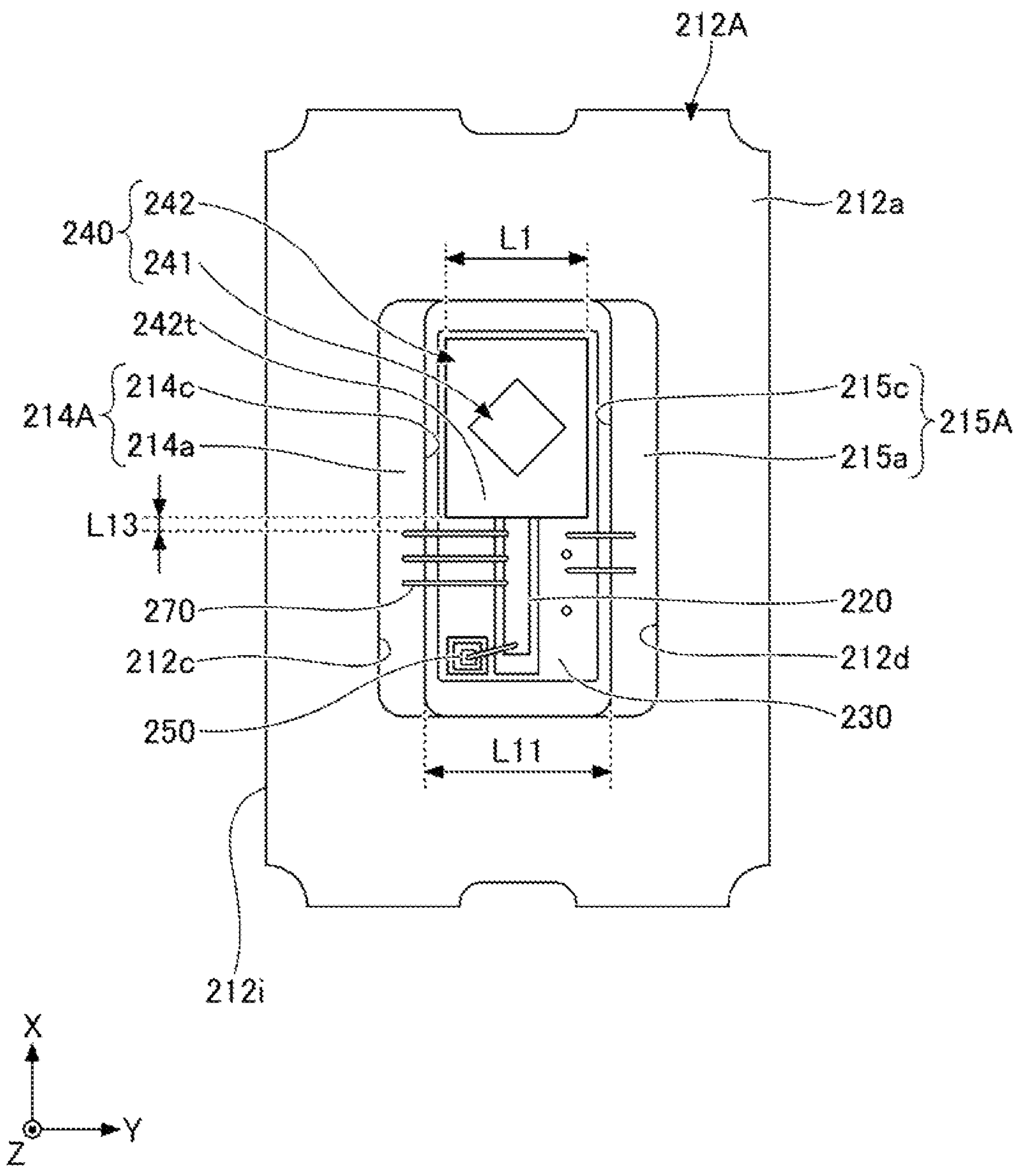
FIG. 12 is a schematic top view illustrating an internal structure of the light emitting device according to the second embodiment.
Figure 13:
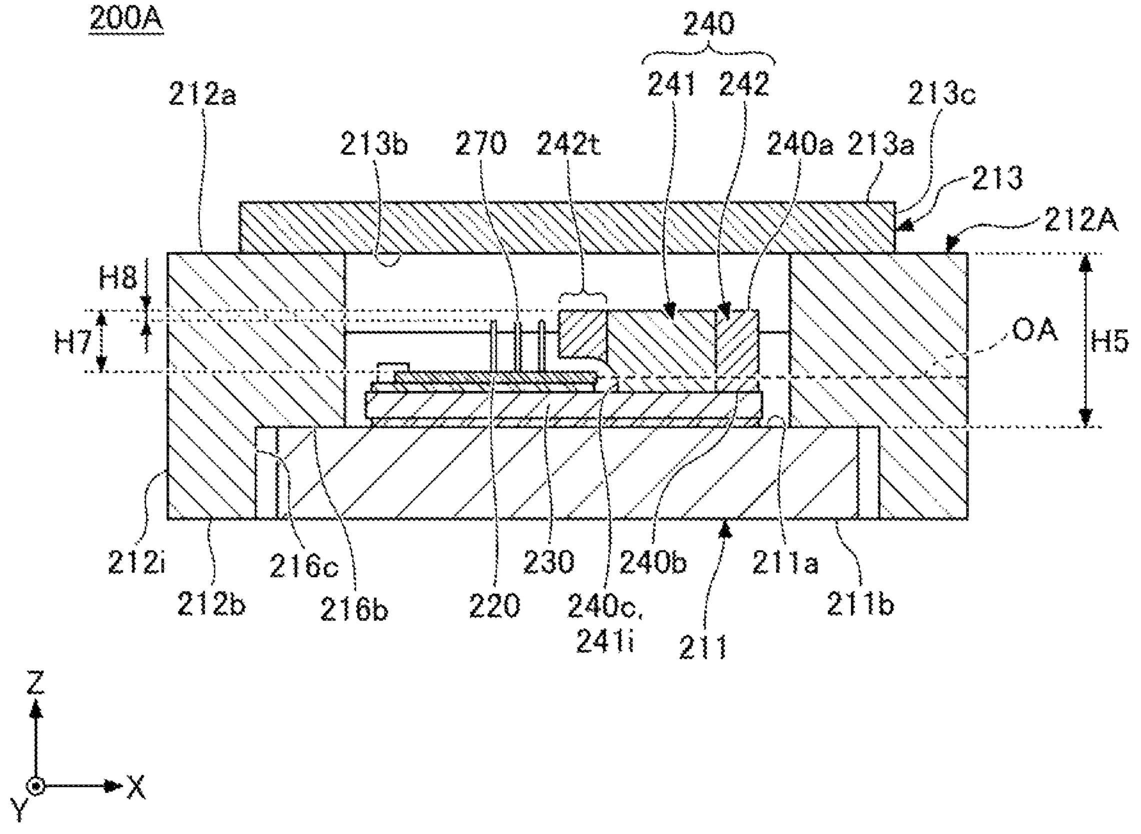
FIG. 13 is a schematic cross-sectional view taken along the line XIII-XIII in FIG. 12 and illustrating the light emitting device according to the second embodiment.
Figure 14:
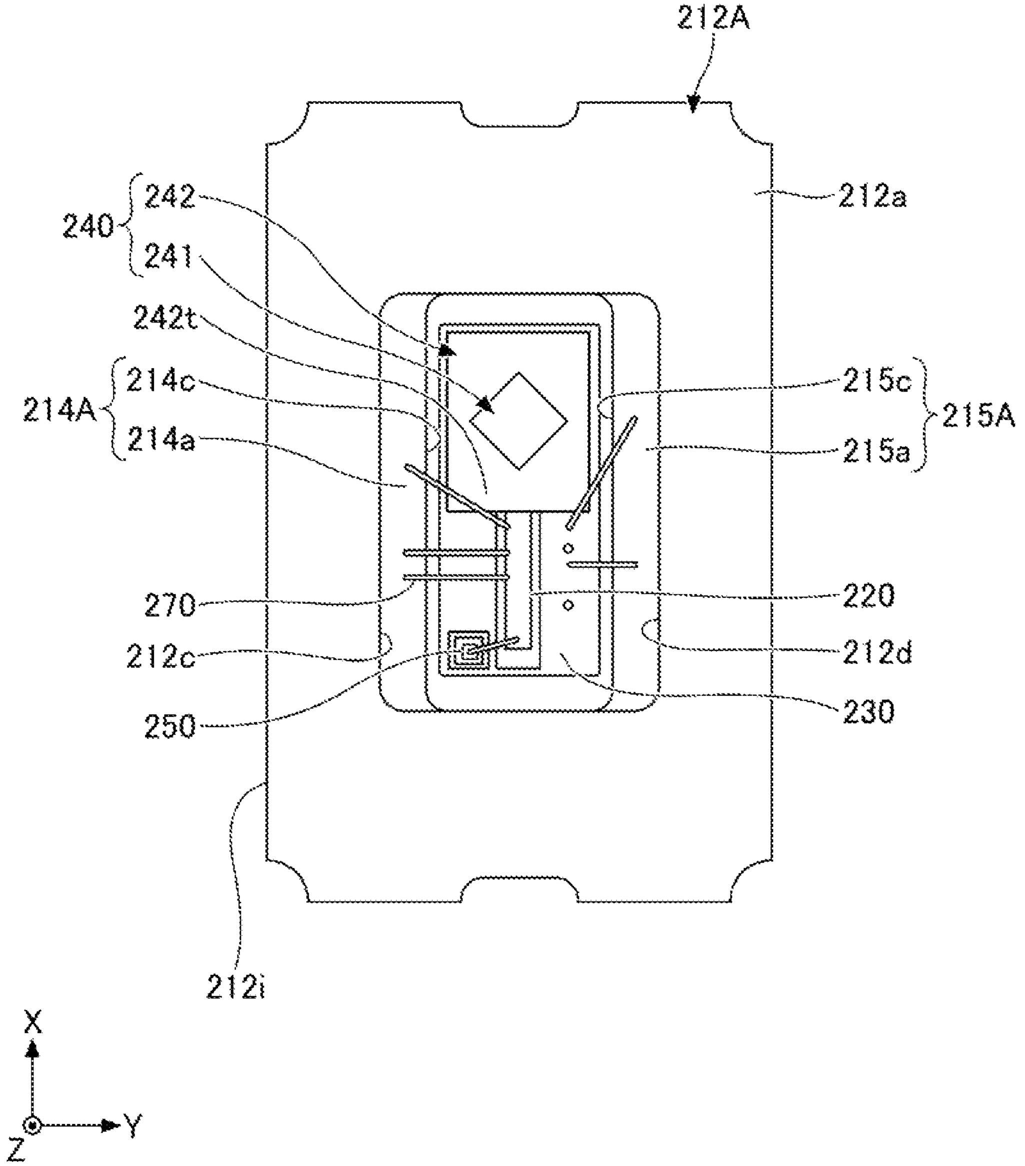
FIG. 14 is a schematic top view illustrating an internal structure of another example of the light emitting device according to the second embodiment.

A light emitting device 200A according to a second embodiment will be described with reference to FIG. 1 and FIGS. 12 through 14. FIG. 1 is a schematic perspective view of the light emitting device 200A according to the second embodiment. FIG. 12 is a schematic top view illustrating the internal structure of the light emitting device 200A according to the second embodiment. FIG. 13 is a schematic cross-sectional view taken along the line XIII-XIII in FIG. 12 and illustrating an example of the light emitting device 200A according to the second embodiment. FIG. 14 is a schematic top view illustrating another internal structure of the light emitting device 200A according to the second embodiment. In FIG. 1 and FIGS. 12 through 14, an X-axis, a Y-axis, and a Z-axis orthogonal to each other are shown for reference. Directions parallel to the X-axis, the Y-axis, and the Z-axis are defined as a first direction X, a second direction Y, and a third direction Z, respectively. The first direction X and the second direction Y are parallel to the upper surface 211*a* of the base member 211, and the third direction Z is perpendicular to the upper surface 211*a* of the base member 211.

As illustrated in FIG. 12, the light emitting device 200A differs from the light emitting device 200 of the first embodiment in that a frame member 212A does not have, at inner edges thereof, stepped portions that are step-shaped in the top view, but has one or more stepped portions provided along the entire length of one edge or two edges of the first upper surface 212*a* extending in the first direction X. In the following, differences of the light emitting device 200A from the light emitting device 200 of the first embodiment will be mainly described, and a description of those aspects shared with the first embodiment will be omitted as appropriate.

<Frame Member 212A>

The frame member 212A has an upper surface 212*a*. One or more stepped portions are provided along the entire length of one edge or two edges extending in the first direction X among the inner edges of the upper surface 212*a*. In the illustrated example, a plurality of stepped portions are provided, which are a first stepped portion 214A and a second stepped portion 215A provided inside the frame member 212A. The first stepped portion 214A has an upper surface 214*a*. The second stepped portion 215A has an upper surface 215*a*. The upper surface 214*a* and the upper surface 215*a* are higher than the upper surface 211*a* of the base member 211 and lower than the upper surface 212*a* of the frame member 212A.

The frame member 212A has a first inner lateral surface 212*c* and a second inner lateral surface 212*d*, which meet the upper surface 212*a* and extend downward. The first inner lateral surface 212*c* meets the upper surface 214*a* of the first stepped portion 214A. The second inner lateral surface 212*d* meets the upper surface 215*a* of the second stepped portion 215A. The first inner lateral surface 212*c* and the second inner lateral surface 212*d* do not meet the upper surface 211*a* of the base member 211. The first stepped portion 214A has a lateral surface 214*c*, which meets the upper surface 214*a* and extends downward. The lateral surface 214*c* meets the upper surface 211*a* of the base member 211. The second stepped portion 215A has a lateral surface 215*c*, which meets the upper surface 215*a* and extends downward. The lateral surface 215*c* meets the upper surface 211*a* of the base member 211. The upper surface 211*a* of the base member 211 has an exposed region between the lateral surface 214*c* and the lateral surface 215*c*. Alternatively, stepped portions are not necessarily provided inside the frame member 212A. In such a case, each of the first inner lateral surface 212*c* and the second inner lateral surface 212*d* meets the upper surface 211*a* of the base member 211. As for the metal films electrically connected to the light emitting element 220, the upper surface 211*a* of the base member 211 is used as the place on which such metal films are provided. However, the movement of the light receiving body 240 and the light emitting element 220 is more easily reduced when one or more stepped portions are provided and have one or more metal films on the upper surfaces thereof bonded to wirings than when the metal films on the upper surface 211*a* of the base member 211 are bonded to wirings. The frame member 212A further includes two inner lateral surfaces. One of two inner lateral surfaces connects the first inner lateral surface 212*c* and the second inner lateral surface 212*d*, and the other connects the lateral surface 214*c* and the lateral surface 215*c*.

<Light Emitting Device 200A>

In the following, the light emitting device 200A will be described with reference to FIG. 1 and FIGS. 12 through 14.

The light emitting element 220 and the light receiving body 240 are located between the edge at which the lateral surface 214*c* and the upper surface 211*a* meet and the edge at which the lateral surface 215*c* and the upper surface 211*a* meet. As in the example illustrated in FIG. 12, the difference in the second direction Y between the length L1 of the light receiving body 240 and the length L11 between the lateral surface 214*c* and the lateral surface 215*c* of the frame member 212A may be set to 1000 μm or less. With the light receiving body 240 having such a size, the size of the light emitting device 200A as a whole can be reduced.

In the example illustrated in FIG. 13, the light emitting element 220 and the light receiving body 240 in the light emitting device 200A are disposed on one submount 230. The lower surface 240*b* of the light receiving body 240 is bonded to the upper surface of the submount 230 via a bonding member. By disposing the light emitting element 220 and the light receiving body 240 on the same submount 230 as described above, the light emitting element 220 and the light receiving body 240 can be brought close to each other. As a result, light from the light emitting element 220 may readily be incident on the light receiving body 240 even when the submount 230 falls off. Moreover, the miniaturization of the light emitting device 200A can be achieved. In the illustrated example, the length of the light receiving body 240 in the third direction Z is shorter than the distance from the upper surface of the light emitting element 220 to the lower surface 213*b* of the cover 213. As illustrated in FIG. 13, the end point of the submount 230 located furthest toward the light traveling direction side in the second direction Y in the side elevation view is located further toward the light traveling direction side than the end point of the light receiving body 240 located furthest toward the light traveling direction side in the second direction Y Such an arrangement can increase heat dissipation from the lower surface of the light receiving body 240 to the submount 230. Alternatively, as in the first embodiment, the end point of the submount 230 located furthest toward the light traveling direction side in the second direction Y may be located in the direction opposite to the light traveling direction with respect to the end point of the light receiving body 240 located furthest toward the light traveling direction side in the second direction Y.

As described above, the light emitting device 200A is configured such that the light receiving body 240 and the entirety of the light emitting device 200A can miniaturize. When compared with the light emitting device 200 according to the first embodiment, however, there is a risk that the movement of the light receiving body 240 in the first direction X may be less restricted. In consideration of this, how to bond the wirings 270 may be devised to reduce the movement of the light receiving body 240 in the first direction X. The one or more wirings 270 are bonded to the upper surface 214*a* of the first stepped portion 214A and/or the upper surface 215*a* of the second stepped portion 215A.

In the third direction Z, the distance H7 from the upper surface 240*a* of the light receiving body 240 to the upper surface of the light emitting element 220 is longer than the distance H8 from the upper surface 240*a* of the light receiving body 240 to the uppermost point of the wirings 270. As is measured from the upper surface 211*a* of the base member 211, the height of the uppermost point of the wirings 270 is higher than the lower surface of the protrusion 242*t* of the light receiving body 240. Bonding the wirings 270 in such a way as to achieve the noted height can reduce the movement of the light receiving body 240 in the first direction X at the time of falling off. In the illustrated example, further, the uppermost point of the wirings 270 is positioned higher than the upper surface 214*a* and/or the upper surface 215*a*.

In the third direction Z, the distance from the upper surface 211*a* of the base member 211 to the uppermost point of the wirings 270 is preferably longer than half of the distance H5 from the upper surface 211*a* to the lower surface 213*b* of the cover 213. In the illustrated example, the distance H8 is, for example, not less than 0.1 times and not more than 0.8 times the distance H7. More preferably, the distance H8 is less than or equal to 0.5 times the distance H7. Bonding the wirings 270 in this manner allows for reducing the movement of the light receiving body 240 in the first direction X. The distance H8 is, for example, −200 μm or more and 500 μm or less. Here, the minus value indicates that the uppermost point of the wirings 270 is at a position higher than the upper surface 240*a* of the light receiving body 240, and the plus value indicates that the uppermost point of the wirings 270 is at a position lower than the upper surface 240*a* of the light receiving body 240. That is, the uppermost point of the wirings 270 is, for example, 200 μm or less above, and 500 μm or less below, the upper surface 240*a* of the light receiving body 240.

Further, among the one or more wirings 270 bonded to the upper surface of the light emitting element 220 in the top view, the wiring 270 closest to the light receiving body 240 in the first direction X is bonded to the upper surface 214*a* and/or the upper surface 215*a* on the light traveling direction side of the midpoint of the light emitting element 220 in the first direction X. Bonding the wirings 270 in this manner allows for narrowing the range in which the light receiving body 240 moves in the first direction X. In the illustrated example, at least one wiring 270 among the plurality of wirings 270 bonded to the upper surface 214*a* is bonded to the upper surface 214*a* on the light traveling direction side of the midpoint of the light emitting element 220. Among the plurality of wirings 270 bonded to the upper surface 215*a*, at least one wiring 270 is bonded to the upper surface 215*a* on the light traveling direction side of the midpoint of the light emitting element 220. The protective element 250 is disposed on the upper surface of the submount 230 further in the direction opposite to the light traveling direction with respect to the midpoint of the light emitting element 220 in the light traveling direction.

The distance L13 from the end of the protrusion 242*t* of the light receiving body 240 to the end of the wirings 270 in the first direction X in the top view is preferably 50 μm or more and 1200 μm or less. With such a dimensional relationship, even when the light receiving body 240 falls off the submount 230, the wirings 270 block the end of the protrusion 242*t* of the light receiving body 240, thereby restricting the movement of the light receiving body 240 in the first direction X. For example, even when the light receiving body 240 falls off the submount 230, the light receiving body 240 can readily stay at such a position as to receive light from the light emitting element 220. As a result, the light emitted from the light emitting element 220 is less likely to exit directly from the light emitting device 200A, which enables the realization of a highly safe light emitting device 200A.

As in the example illustrated in FIG. 14, the end of a wiring 270 opposite to the end bonded to the light emitting element 220 at a position close to the protrusion 242*t* may be bonded to the upper surface of the step on the light traveling direction side of the protrusion 242*t*. In the illustrated example, the light emitting device 200A includes two wirings 270, one bonded to the upper surface 214*a* of the first stepped portion 214A and the other bonded to the upper surface 215*a* of the second stepped portion 215A, on the light traveling direction side of the protrusion 242*t*. The two wirings 270 are bonded to the upper surfaces 214*a* and 215*a* such as to extend over the upper surface 240*a* of the light receiving body 240 in the top view. Bonding the wirings 270 to the upper surfaces 214*a* and 215*a* in this manner allows for reducing the movement of the light receiving body 240 in the third direction Z.

In the third direction Z, the optical axis OA of the light emitted from the light emitting element 220 is preferably located below the point that is half the distance H5 from the upper surface 211*a*, i.e., half the distance between the upper surface 211*a* and the lower surface 213*b* as measured from the upper surface 211*a* of the base member 211.

The light emitting devices 200 and 200A may be used, for example, in a vehicle headlight. Without being limited to such usage, the light emitting devices 200 and 200A may be used as light sources such as those used in a light, a projector, a head mounted display, and a display backlight.

Although preferred embodiments and the like have heretofore been described in detail, the present invention is not limited to the above-described embodiments and the like, and various modifications and substitutions may be made to the above-described embodiments and the like without departing from the scope defined in the claims.

What is claimed is:

1. A light emitting device comprising:

a package including a base member, a frame member having a plurality of inner lateral surfaces, and a cover;

a light emitting element surrounded by the frame member and disposed on an upper surface of the base member, the light emitting element being configured to emit directional light traveling in a lateral direction; and a light receiving body surrounded by the frame member and disposed on the upper surface of the base member at a lateral side of the light emitting element to receive the light, wherein the cover has a lower surface, at least a part of the lower surface of the cover being located over the light receiving body and the light emitting element, when an optical axis direction of the directional light emitted from the light emitting element is a first direction, the plurality of inner lateral surfaces of the package include a first inner lateral surface and a second inner lateral surface facing each other in a second direction perpendicular to the first direction in a top view, the light emitting element is disposed in a first arrangement region located between the first inner lateral surface and the second inner lateral surface, in the second direction, a length of the light receiving body is longer than a distance between the first inner lateral surface and the second inner lateral surface, in a third direction perpendicular to the upper surface of the base member, a height of an upper surface of the light receiving body from the upper surface of the base member is higher than a height of an upper surface of the light emitting element from the upper surface of the base member, a height of a lower surface of the light receiving body from the upper surface of the base member is lower than a height of a lower surface of the light emitting element from the upper surface of the base member, and a length of the light receiving body is longer than a distance from the upper surface of the light emitting element to the lower surface of the cover, the light receiving body has a first lateral surface facing the light emitting element and a second lateral surface opposite to the first lateral surface, and the second lateral surface of the light receiving body faces a first opposing surface arranged adjacent to the second lateral surface with a space being formed between the second lateral surface and the first opposing surface.

2. The light emitting device as claimed in claim 1, wherein the plurality of inner lateral surfaces of the package include a third inner lateral surface and a fourth inner lateral surface facing each other in the second direction, the light receiving body is disposed in a second arrangement region located between the third inner lateral surface and the fourth inner lateral surface, the light receiving body further includes a third lateral surface meeting the second lateral surface and extending in the first direction, and a fourth lateral surface meeting the second lateral surface and extending in the first direction, and the third lateral surface of the light receiving body faces a second opposing surface arranged adjacent to the third lateral surface with a space being formed between the third lateral surface and the second opposing surface, and the fourth lateral surface of the light receiving body faces a third opposing surface arranged adjacent to the fourth lateral surface with a space being formed between the fourth lateral surface and the third opposing surface.

3. The light emitting device as claimed in claim 2, wherein in the second direction, a distance between the third inner lateral surface and the fourth inner lateral surface is longer than a distance between the first inner lateral surface and the second inner lateral surface.

4. The light emitting device as claimed in claim 2, wherein the third inner lateral surface constitutes the second opposing surface, and the fourth inner lateral surface constitutes the third opposing surface.

5. The light emitting device as claimed in claim 2, wherein in the second direction, a length of the space between the second opposing surface and the third lateral surface of the light receiving body is 50 μm or more and 400 μm or less, and a length of the space between the third opposing surface and the fourth lateral surface of the light receiving body is 50 μm or more and 400 μm or less.

6. The light emitting device as claimed in claim 2, wherein the plurality of inner lateral surfaces of the package further include a fifth inner lateral surface that connects the third inner lateral surface and the fourth inner lateral surface, the fifth inner lateral surface is located on an opposite side of the light receiving body from the light emitting element, and the fifth inner lateral surface constitutes the first opposing surface.

7. The light emitting device as claimed in claim 1, wherein in the first direction, a length of the space between the first opposing surface and the second lateral surface of the light receiving body is 50 μm or more and 400 μm or less.

8. The light emitting device as claimed in claim 1, wherein a space is formed between the upper surface of the light receiving body and the lower surface of the cover, and in the third direction, a length of the space between the upper surface of the light receiving body and the lower surface of the cover is 50 μm or more and 400 μm or less.

9. The light emitting device as claimed in claim 1, wherein the light receiving body is bonded to a member only at the lower surface of the light receiving body.

10. The light emitting device as claimed in claim 1, wherein in the first direction, a length of the light receiving body is longer than a length of the light emitting element.

11. The light emitting device as claimed in claim 1, further comprising a submount disposed on the upper surface of the base member, wherein the lower surface of the light receiving body is bonded to an upper surface of the submount via a bonding member.

12. The light emitting device as claimed in claim 11, wherein the upper surface of the submount is not located above the lower surface of the light emitting element.

13. The light emitting device as claimed in claim 1, wherein the light receiving body further includes an incident lateral surface and an emission surface, such that light emitted from an emission end surface of the light emitting element enters the incident lateral surface, and the light having entered the incident lateral surface is emitted from the emission surface, the incident lateral surface constitutes at least a part of the first lateral surface, the light receiving body further includes a protrusion protruding outwardly toward the light emitting element above the incident lateral surface, and the protrusion of the light receiving body overlaps the emission end surface of the light emitting element in the top view.

14. The light emitting device as claimed in claim 13, wherein in the first direction, a distance from the incident lateral surface of the light receiving body to the emission end surface of the light emitting element is 400 μm or less.

15. The light emitting device as claimed in claim 13, wherein the emission surface of the light receiving body is located on the upper surface of the light receiving body to upwardly emit the light having entered the incident lateral surface.

16. The light emitting device as claimed in claim 13, wherein at least a part of the incident lateral surface of the light receiving body is located below an optical axis of the light emitted from the light emitting element.

17. The light emitting device as claimed in claim 3, wherein in the first direction, one of ends of the third inner lateral surface that is closer to the second lateral surface of the light receiving body is spaced apart from one of ends of the first inner lateral surface that is closer to the second lateral surface of the light receiving body, and one of ends of the fourth inner lateral surface that is closer to the second lateral surface of the light receiving body is spaced apart from one of ends of the second inner lateral surface that is closer to the second lateral surface of the light receiving body.

* * * * *